(12) United States Patent
Lee et al.

(10) Patent No.: US 9,177,801 B2
(45) Date of Patent: Nov. 3, 2015

(54) FINFET DEVICE HAVING A STRAINED REGION

(71) Applicant: TAIWAN SEMICONDUCTOR MANUFACTURING COMPANY, LTD., Hsin-Chu (TW)

(72) Inventors: Tsung-Lin Lee, Hsinchu (TW); Feng Yuan, Yonghe (TW); Hung-Li Chiang, Taipei (TW); Chih Chieh Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/579,774

(22) Filed: Dec. 22, 2014

(65) Prior Publication Data

US 2015/0179454 A1    Jun. 25, 2015

Related U.S. Application Data

(62) Division of application No. 13/416,926, filed on Mar. 9, 2012, now abandoned.

(51) Int. Cl.

| H01L 21/336 | (2006.01) |
| --- | --- |
| H01L 21/265 | (2006.01) |
| H01L 29/78 | (2006.01) |
| H01L 21/324 | (2006.01) |
| H01L 29/10 | (2006.01) |
| H01L 29/66 | (2006.01) |

(52) U.S. Cl.
CPC ............ *H01L 21/265* (2013.01); *H01L 21/324* (2013.01); *H01L 29/1054* (2013.01); *H01L 29/66795* (2013.01); *H01L 29/7847* (2013.01); *H01L 21/26506* (2013.01); *H01L 21/26586* (2013.01); *H01L 29/66545* (2013.01)

(58) Field of Classification Search
CPC ............ H01L 29/786; H01L 29/66795; H01L 29/7842; H01L 29/1054; H01L 27/1211; H01L 21/823821; H01L 202/7858; H01L 29/41791; H01L 29/7847; H01L 21/845
See application file for complete search history.

(56) References Cited

U.S. PATENT DOCUMENTS

| 7,341,902 | B2 | 3/2008 | Anderson et al. |
| --- | --- | --- | --- |
| 7,834,399 | B2 | 11/2010 | Kanarsky et al. |
| 7,968,915 | B2 | 6/2011 | Kanarsky et al. |
| 8,394,684 | B2 | 3/2013 | Kanakasabapathy et al. |
| 8,445,334 | B1 | 5/2013 | Basker et al. |
| 8,847,293 | B2 | 9/2014 | Lee |
| 2004/0217420 | A1 | 11/2004 | Yeo et al. |
| 2008/0079094 | A1 | 4/2008 | Jin et al. |
| 2008/0173942 | A1 | 7/2008 | Zhu et al. |
| 2009/0242944 | A1 | 10/2009 | Zhang et al. |
| 2009/0261412 | A1 | 10/2009 | Saito et al. |

(Continued)

*Primary Examiner* — Bac Au
(74) *Attorney, Agent, or Firm* — Haynes and Boone, LLP

(57) ABSTRACT

A method of fabricating a semiconductor device includes providing a substrate having a fin disposed thereon. A gate structure is formed on the fin. The gate structure interfaces at least two sides of the fin. A stress film is formed on the substrate including on the fin. The substrate including the stress film is annealed. The annealing provides a tensile strain in a channel region of the fin. For example, a compressive strain in the stress film may be transferred to form a tensile stress in the channel region of the fin.

20 Claims, 25 Drawing Sheets

(56) References Cited

U.S. PATENT DOCUMENTS

| | | |
|---|---|---|
| 2011/0027978 A1 | 2/2011 | Hargrove et al. |
| 2011/0084336 A1 | 4/2011 | Luning et al. |
| 2011/0171805 A1 | 7/2011 | Yu et al. |
| 2013/0200455 A1 | 8/2013 | Lo et al. |
| 2013/0200468 A1 | 8/2013 | Cai et al. |
| 2013/0228830 A1 | 9/2013 | Lee et al. |
| 2013/0228862 A1 | 9/2013 | Lee |
| 2013/0237026 A1 | 9/2013 | Lee |

FINFET DEVICE HAVING A STRAINED REGION

CROSS-REFERENCE

The present disclosure is a divisional patent application of the following U.S. patent application and claims thereof, the entire disclosure of which is incorporated herein by reference: U.S. Ser. No. 13/416,926 filed Mar. 9, 2012 for "FINFET DEVICE HAVING A STRAINED REGION".

BACKGROUND

The semiconductor integrated circuit (IC) industry has experienced rapid growth. Over the course of this growth, functional density of the devices has generally increased by the device feature size or geometry has decreased. This scaling down process generally provides benefits by increasing production efficiency, lower costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type transistors, also referred to as finFET devices, so called because the channel is formed on a "fin" that extends from the substrate. FinFET devices may allow for shrinking the gate width of device while providing a gate on the sides and/or top of the fin including the channel region.

Another manner improving the performance of a semiconductor device is to provide stress on or strain in pertinent regions of the device. For example, inducing a higher tensile strain in a region provides for enhanced electron mobility, which may improve performance. Thus, what is desired are fabrication methods and devices that provide for stress/strain in regions of a finFET device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
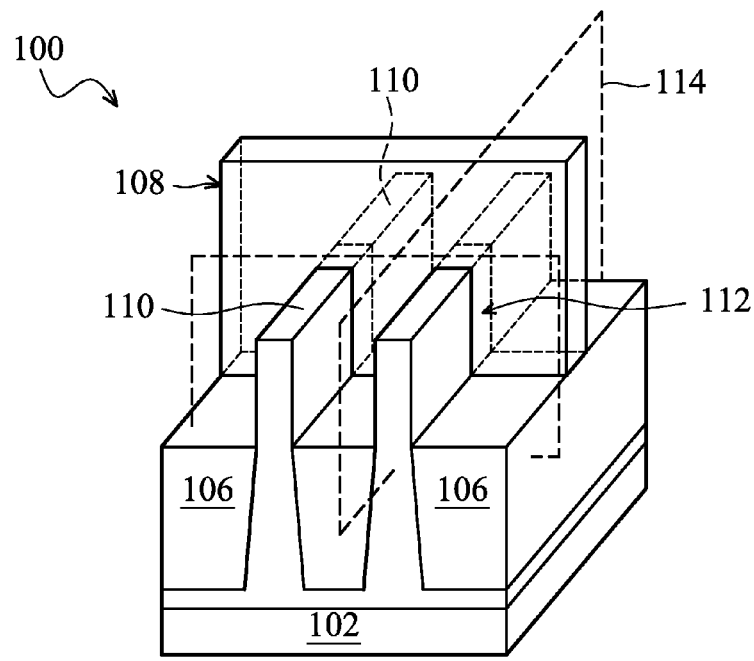
FIG. 1A is perspective view of an embodiment of a semiconductor device formed according to one or more aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Additionally, the present disclosure may repeat reference numerals and/or letters in the various examples. This repetition is for the purpose of simplicity and clarity and does not in itself dictate a relationship between the various embodiments. It is understood that those skilled in the art will be able to devise various equivalents that, although not specifically described herein that embody the principles of the present disclosure.

It is also noted that the present disclosure presents embodiments in the form of multi-gate transistors or fin-type multi-gate transistors referred to herein as finFET devices. Such a device may include a p-type metal oxide semiconductor finFET device or an n-type metal oxide semiconductor finFET device. The finFET device may be a dual-gate device, tri-gate device, and/or other configuration. One of ordinary skill may recognize other embodiments of semiconductor devices that may benefit from aspects of the present disclosure.

Figure 1B:
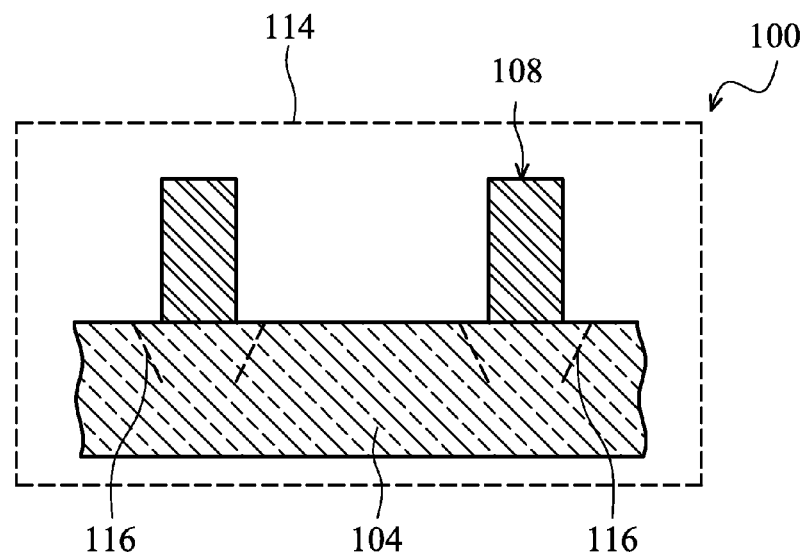
FIG. 1B is a cross-sectional view of the semiconductor device.

Illustrated in FIGS. 1A and 1B is a semiconductor device 100. The semiconductor device 100 includes finFET type device(s). The semiconductor device 100 may be included in an IC such as a microprocessor, memory device, and/or other IC. The device 100 includes a substrate 102, a plurality of fins 104, a plurality of isolation structures 106, and a gate structure 108 disposed on each of the fins 104. Each of the plurality of fins 104 include a source/drain region denoted 110 where a source or drain feature is formed in, on, and/or surrounding the fin 104. A channel region of the fin 104 underlies the gate structure 108 and is denoted as 112.

The substrate 102 may be a silicon substrate. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 102 is a semiconductor on insulator (SOI).

The isolation structures 106 may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures are STI features and are formed by etching trenches in the substrate 102. The trenches may then be filled with isolating material, followed by a chemical mechanical polish (CMP). Other fabrication techniques for the isolation structures 106 and/or the fin structure 104 are possible. The isolation structures 106 may include a multilayer structure, for example, having one or more liner layers.

The fin structures 104 may provide an active region where one or more devices are formed. In an embodiment, a channel (112) of a transistor device is formed in the fin 104. The fin 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into the silicon layer, leaving an extending fin. The recesses may be etched using reactive ion etch (RIE) and/or other suitable processes. Numerous other embodiments of methods to form the fins 104 on the substrate 102 may be suitable.

In an embodiment, the fins 104 are approximately 10 nanometer (nm) wide and between approximately 15 nm and 40 nm high. However, it should be understood that other dimensions may be used for the fins 104. The height may be measured from the fin 104 protrusion above the isolation feature 106. The fins 104 may be doped using n-type and/or p-type dopants.

The gate structure 108 may include a gate dielectric layer, a gate electrode layer, and/or one or more additional layers. In an embodiment, the gate structure 108 is a sacrificial gate structure such as formed in a replacement gate process used to form a metal gate structure. In an embodiment, the gate structure 108 includes polysilicon. In an embodiment, the gate structure includes a metal gate structure.

A gate dielectric layer of the gate structure 108 may include silicon dioxide. The silicon oxide may be formed by suitable oxidation and/or deposition methods. Alternatively, the gate dielectric layer of the gate structure 108 may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

In an embodiment, the gate structure 108 may be a metal gate structure. The metal gate structure may include interfacial layer(s), gate dielectric layer(s), work function layer(s), fill metal layer(s) and/or other suitable materials for a metal gate structure. In other embodiments, the metal gate structure 108 may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), chemical vapor deposition (CVD), and/or other suitable formation process.

Exemplary p-type work function metals that may be included in the gate structure 108 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, physical vapor deposition (PVD), and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure.

The semiconductor device 100 may include other layers and/or features not specifically illustrated including additional source/drain regions, interlayer dielectric (ILD) layers, contacts, interconnects, and/or other suitable features.

It is noted that the semiconductor device 100 illustrates a cut-line 114 that indicates the cross-section illustrated in FIG. 1b.

The semiconductor device 100 has a strain/stress in the fins 104 for example, in the channel region 112. In an embodiment, a tensile strain may be generated. The stress/strain may be obtained using one or more of the methods, such as the method 200, the method 900, the method 1500, and/or the method 2300, described below with reference to FIGS. 2, 9, 15, and 23 respectively. The strain 116 is illustrated. In an embodiment, the strain 116 is illustrative of a strain in the fin 104 that provides a tensile stress onto the channel region of the semiconductor device 100. In an embodiment, the strain 116 provides a symmetrical stress to the channel region. The tensile stress on the channel region may provide for increased mobility in the channel region.

Figure 2:
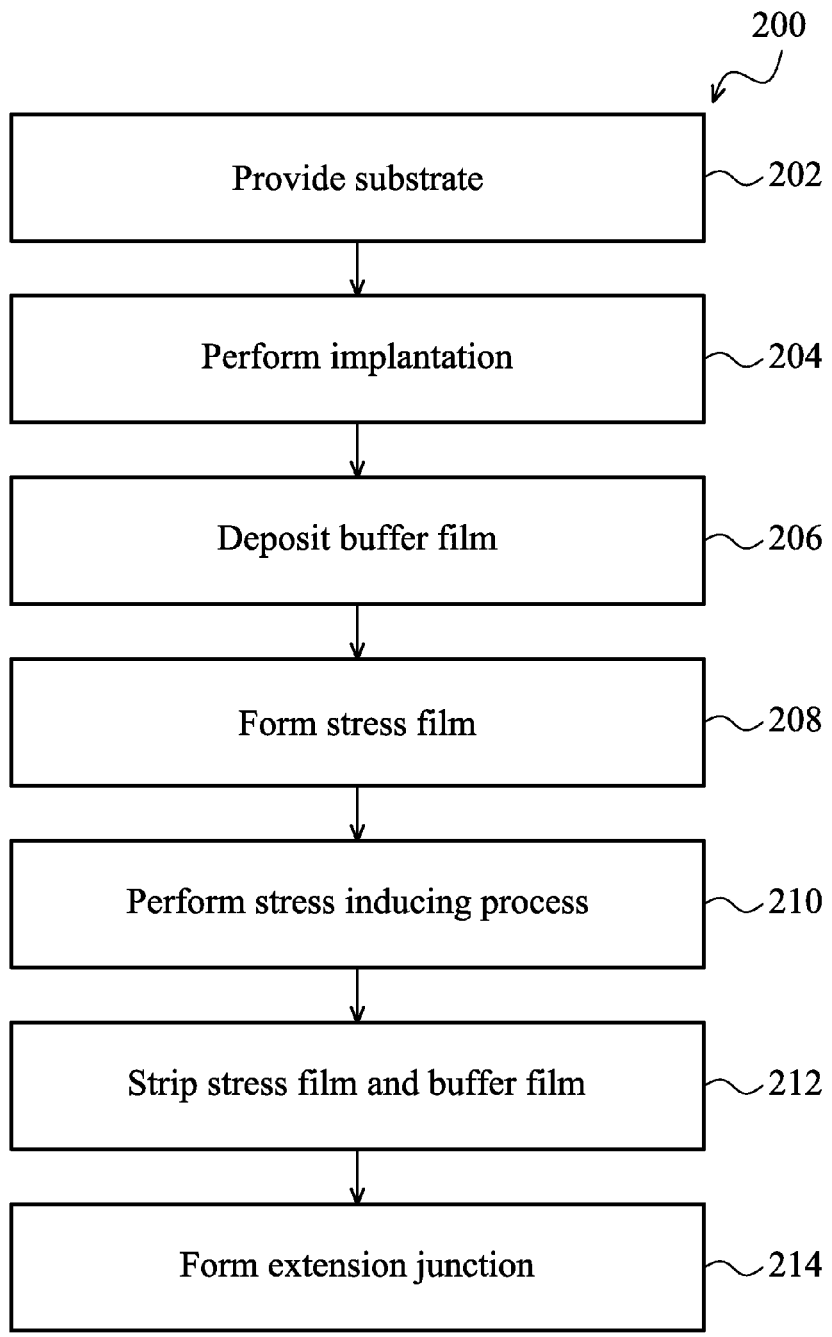
FIG. 2 is a flow chart illustrating an embodiment of a method of forming a semiconductor device according to various aspects of the present disclosure.
Figure 3:
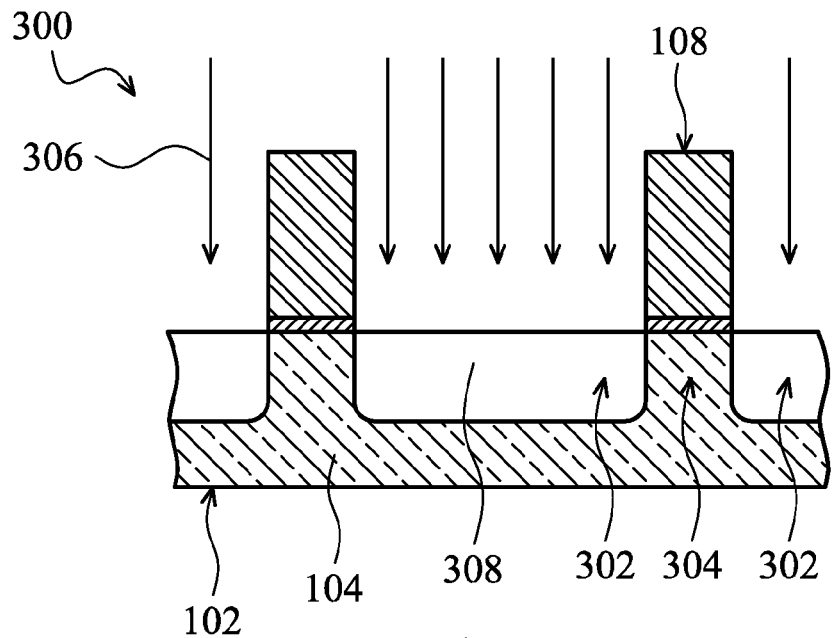
FIGS. 3, 4A, 4B, 5, 6, 7, and 8 each illustrate cross-sectional views of one embodiment of a semiconductor device at various stages of fabrication according to the method of FIG. 2.

Referring now to FIG. 2, illustrated is flow chart of a method 200 of semiconductor fabrication according to one or more aspects of the present disclosure. The method 200 may be implemented to increase a stress or stain provided in one or more regions of a semiconductor device such as a fin-type field effect transistor (finFET). FIGS. 3, 4A, 4B, and 5-8 are cross-sectional views of an embodiment of a semiconductor device 300 fabricated according to steps the method 200 of FIG. 2. It should be understood that FIGS. 3, 4A, 4B, and 5-8 and the device 300 are representative only and not intended to be limiting.

It should be further understood that the method 200 includes steps having features of a complementary metal-oxide-semiconductor (CMOS) technology process flow and thus, are only described briefly herein. Additional steps may be performed before, after and/or during the method 200. Similarly, one may recognize other portions of a device that may benefit from the methods described herein. It is also understood that parts of the semiconductor device 300 may be fabricated by CMOS technology and thus, some processes are only described briefly herein. Further, the semiconductor device 300 may include various other devices and features, such as additional transistors, bipolar junction transistors, resistors, capacitors, diodes, fuses, etc., but is simplified for a better understanding of the inventive concepts of the present disclosure. The semiconductor device 300 may include a plurality of devices interconnected.

The method 200 begins at block 202 where a semiconductor substrate is provided. The semiconductor substrate may be substantially similar to as discussed above with reference to the semiconductor substrate 102 of the semiconductor device 100, described with reference to FIGS. 1A and 1B. In an embodiment, the semiconductor substrate includes a plurality of fins extending from the substrate. An isolation region (e.g., STI feature) may interpose the fins as discussed above with reference to the semiconductor device 100. Referring to the example of FIG. 3, a semiconductor device 300 includes a substrate 102 having a fin 104. The semiconductor device 300 may be substantially similar to the semiconductor device 100, described above with reference to FIGS. 1A and 1B.

A gate structure may be disposed on the substrate. In an embodiment, the gate structure is formed on and/or around a fin extending from the substrate. The gate structure may include a plurality of layers such as gate dielectric layers, gate electrode layers, capping layers, hard mask layers, and/or other suitable layers. In an embodiment, the gate structure is sacrificial such as provided in a replacement gate method of forming a metal gate structure. Referring to the example of FIG. 3, a gate structure 108 is disposed on the substrate 102. Specifically, gate structures 108 are disposed on the fin 104. Each gate structure 108 traverses the fin 104, separating a source region from a drain region and defining a channel region. In the semiconductor device 300, the fin 104 is illustrated as including a source/drain region 302 and a channel region 304. The gate structure 108 may be substantially similar to as discussed above with reference to the gate structure 108 of the semiconductor device 100 of FIGS. 1A and 1B.

The method 200 then proceeds to block 204 where an implantation process is performed. In an embodiment, the process is a pre-amorphous implant (PAI). The PAI process may implants a target region of a substrate, damaging the lattice structure of the target region and forming amorphized regions. The implantation process may include implanting species such as germanium (Ge), silicon (Si), carbon (C), xenon (Xe), and/or other suitable species. The implantation process may be performed at an energy of between approximately 0.5 keV and approximately 30 keV. In an embodiment, the implantation process is a substantially vertical implant (e.g., perpendicular to a top surface of the substrate.) In an embodiment, the implantation process is a tilt implant. The tilt angle may be between approximately 0 degrees and approximately 30 degrees. Referring to the example of FIG. 3, a PAI 306 is incident the substrate 102 forming implanted (amorphized) regions 308 of the fin 104. In the present embodiment, the amorphized regions 308 are formed in a source and drain region of semiconductor device 300

The depth of the implantation can be controlled by the implant energy, implant species, and/or implant dosage. The PAI process may implant the substrate with silicon (Si) or germanium (Ge). Alternatively, the PAI process could utilize other implant species, such as Ar, Xe, $BF_2$, As, In, other suitable implant species, or combinations thereof.

The method 200 then proceeds to block 206 where a buffer layer is formed on the substrate. In an embodiment, the buffer layer is between approximately 20 Angstroms (A) and approximately 100 A. In an embodiment, the buffer layer may be between approximately 2 nm and approximately 5 nm in thickness. These thicknesses are by way of example and not intended to be limiting. In an embodiment, the buffer layer is an oxide such as silicon oxide. However, other compositions may be possible. Referring to the example of FIG. 4A, a buffer layer 402 is formed on the substrate 102.

Figure 4A:
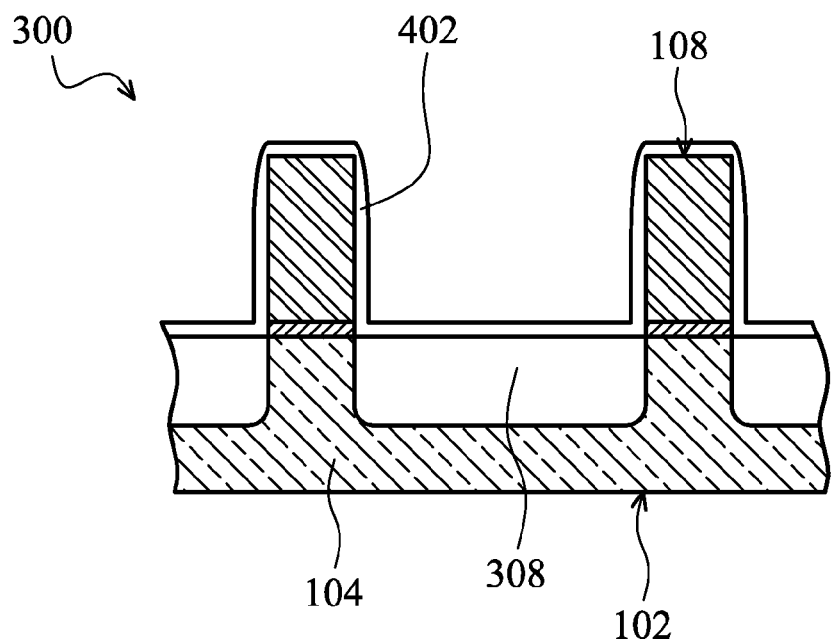
Figure 4B:
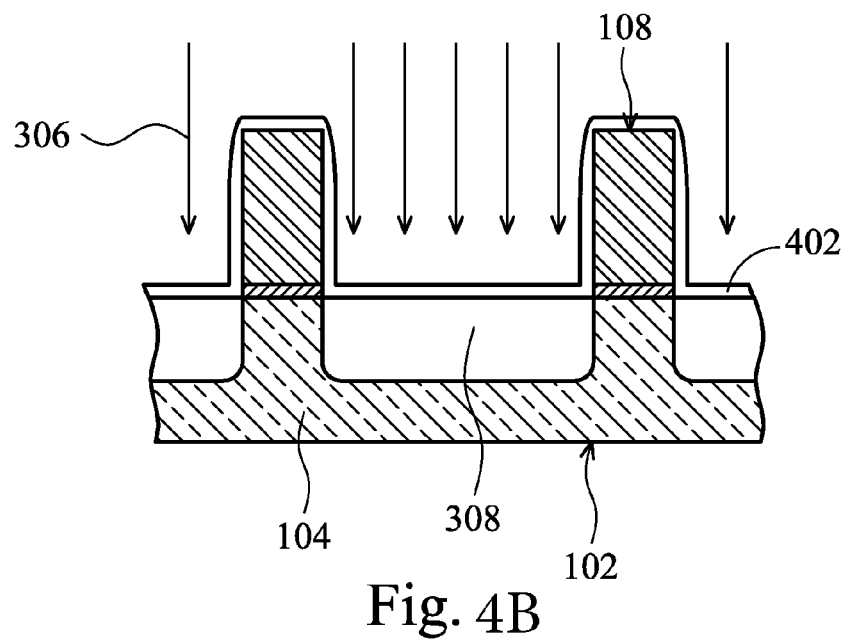
Figure 5:
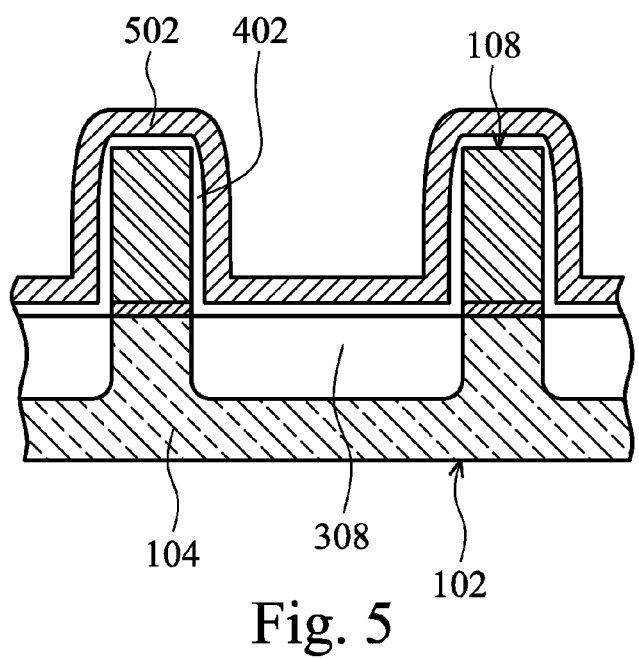
Figure 6:
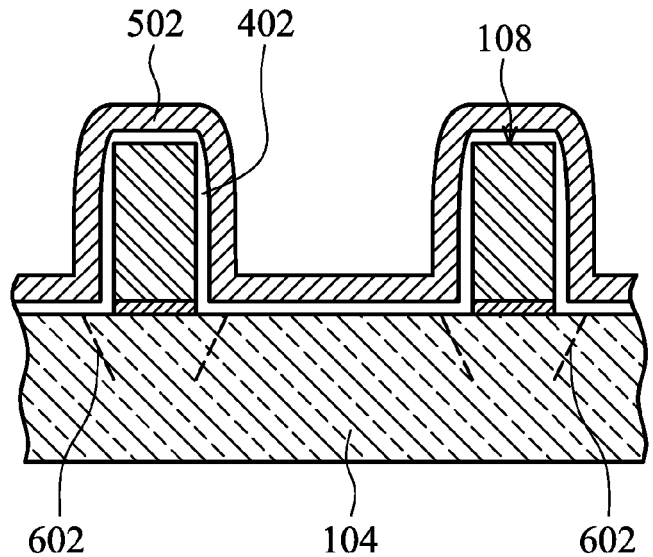
Figure 7:
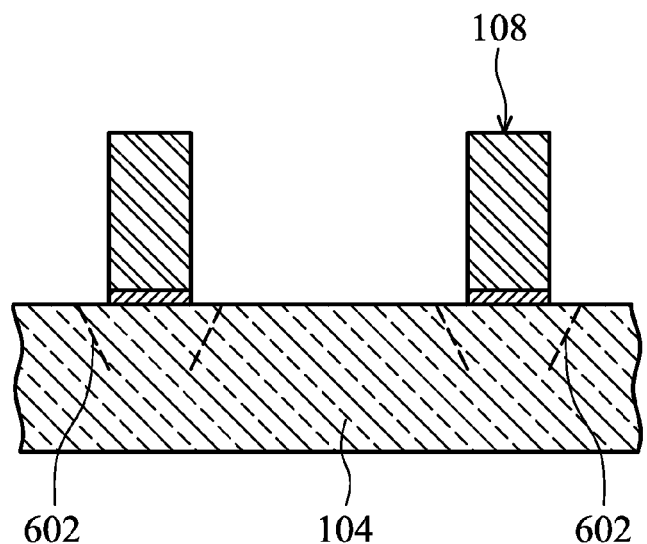
Figure 8:
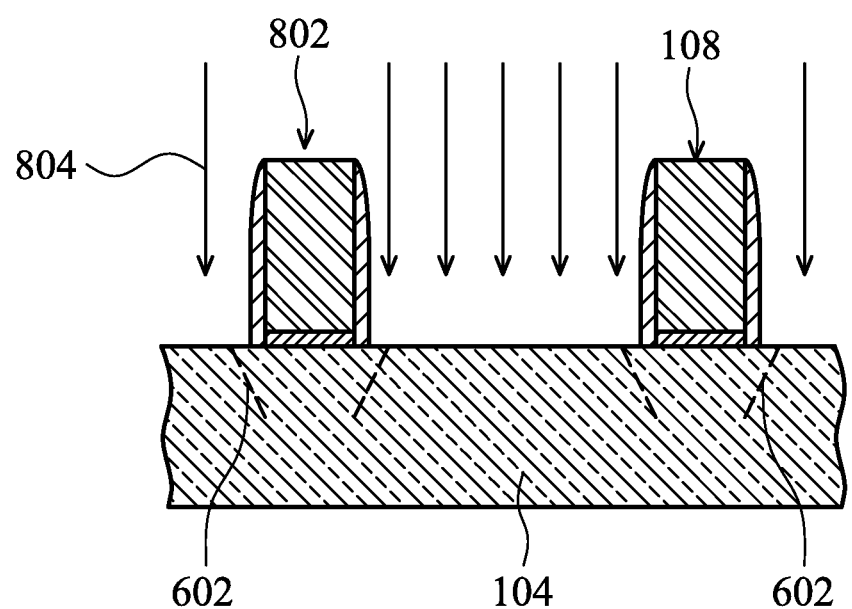

As described above, an implantation (e.g., PAI) is performed prior to the formation of a buffer layer. However, in other embodiments, a buffer layer may be formed prior to the implantation process of block 204. In other words, block 206 precedes block 204. By way of example, FIG. 4B illustrates a PAI 306 while the buffer layer 402 is disposed on the substrate. The buffer layer 402 is formed prior to the PAI implantation 306.

The method 200 then proceeds to block 208 where a stress film is formed on the substrate. The stress film may also be referred to as a stress inducing film In an embodiment, the stress layer is a stress memorization technique (SMT) film. The stress layer may be provided over the device in which stress is desired and the stress of the stress film can be created and transferred to an underlying features/layers. In an embodiment, the stress film is silicon nitride (SiN). The stress film may have a thickness between approximately 200 A and approximately 400 A, by way of example. The stress film may have a compressive strain (e.g., be a compressive stress film). (It is noted that the compressive strain may be converted to a tensile strain in a target region of the fin after block 210). In an embodiment, the stress film is between approximately 10 nm and approximately 40 nm in thickness. The stress film may be formed by plasma enhanced chemical vapor deposition (PECVD) and/or other suitable processes. Referring to the example of FIG. 5, a stress film 502 is disposed on the substrate 102.

The method 200 then proceeds to block 210 where a stress inducing or transferring process is performed. The stress inducing/transferring process includes a treatment that generates and/or transfers a stress from the overlying (compressive) stress layer to an underlying region of the fin. In an embodiment, the treatment includes an anneal process. The anneal may include a rapid thermal anneal (RTA), a single strand anneal (SSA), a laser anneal, a flash anneal, a furnace anneal and/or other suitable processes. In an embodiment, the treatment transfers a compressive strain of the stress film to provide a tensile stress in the fin. Referring to the example of FIG. 6, a strain (or stress) 602 is provided in the fin 104. The strain/stress 602 is generated and transferred by the stress film and/or the treatments discussed above. The stress/strain 602 may provide a symmetrical stress onto a channel region of the fin 104.

The method 200 then proceeds to block 212 where the stress film and/or buffer film is stripped from the substrate. The stress film and/or buffer film may be stripped using suitable etching techniques such as wet etch. The stress film and buffer film may be removed in a single process or a plurality of processes (e.g., distinct removal of each film). The strain induced by the stress film may remain after the stress layer is removed, for example, as the strain has been transferred and "memorized" by a region of the fin. Referring to the example of FIG. 7, the stress film 502 and the buffer layer 402 have been removed from the substrate. The strain 602 in the fin 104 remains.

The method 200 then proceeds to block 214 where a junction is formed by performing a source/drain implant. In an embodiment, a source/drain extension region is formed. The junction may be formed using an ion implantation process. The implantation may include introducing n-type or p-type dopants. Exemplary dopants include arsenic, phosphorous, antimony, boron, boron di-fluoride, and/or other possible impurities. In an embodiment, spacer elements may be formed abutting sidewalls of a gate structure prior to one or more junction implantation processes. The spacer elements may include silicon nitride, silicon oxide, silicon oxynitride, and/or other suitable dielectric materials. In embodiments, the sidewall spacers include a plurality of layers, for example, liner layers. In other embodiments, the implantation process may be performed prior to the formation of any spacer elements and/or the spacer elements omitted. Referring to the example of FIG. 8, sidewall spacers 802 are disposed on the sidewalls of the gate structure 108. An implant 804 is incident the substrate 102. The implantation 804 may provide a suitably doped region in which to form a source/drain region associated with the corresponding gate structure 108. The source/drain region may include an source/drain extension region.

The method 200 may continue to include further CMOS or MOS technology processing to form various features known in the art. Exemplary processes that may be performed include the formation of contact features coupled to the gate structure and/or source/drain regions and a multi-layer interconnect (MLI) having via and interconnect lines that may interconnect one or more semiconductor devices formed on the substrate. In an embodiment, the gate structure described above is a sacrificial gate structure and a replacement gate is formed using a suitable replacement gate (e.g., gate last) methodology.

Figure 9:
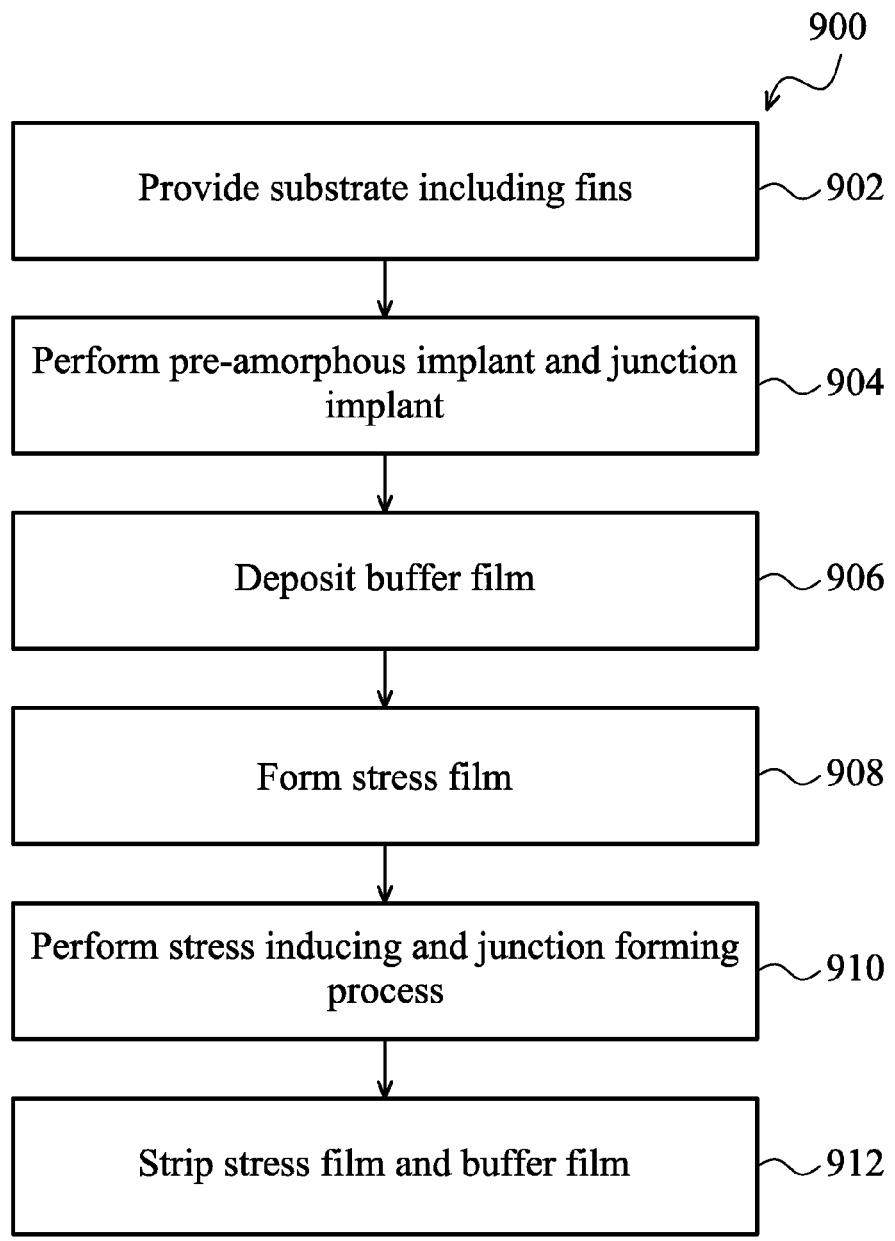
FIG. 9 is a flow chart illustrating another embodiment of a method of forming a semiconductor device according to various aspects of the present disclosure.

Referring now to FIG. 9, illustrated is flow chart of a method 900 of semiconductor fabrication according to one or more aspects of the present disclosure. The method 900 may be implemented to increase a stress or stain provided in one or more regions of a semiconductor device such as a fin-type field effect transistor (finFET). FIGS. 10, 11A, 11B, and 12-14 are cross-sectional views of an embodiment of a semiconductor device 1000 fabricated according to steps the method 900 of FIG. 9. It should be understood that FIGS. 10, 11A, 11B, and 12-14 and the device 1000 are representative only and not intended to be limiting.

It should be further understood that the method 900 includes steps having features of a complementary metal-oxide-semiconductor (CMOS) technology process flow and thus, are only described briefly herein. Additional steps may be performed before, after and/or during the method 900. Similarly, one may recognize other portions of a device that may benefit from the methods described herein. It is also understood that parts of the semiconductor device 1000 may be fabricated by CMOS technology and thus, some processes are only described briefly herein. Further, the semiconductor device 1000 may include various other devices and features, such as additional transistors, bipolar junction transistors, resistors, capacitors, diodes, fuses, etc., but is simplified for a better understanding of the inventive concepts of the present disclosure. The semiconductor device 1000 may include a plurality of devices interconnected.

The method 900 begins at block 902 where a semiconductor substrate is provided. The semiconductor substrate may be substantially similar to as discussed above with reference to the semiconductor substrate 102 of the semiconductor device 100, described with reference to FIGS. 1A and 1B. In an embodiment, the semiconductor substrate includes a plurality of fins extending from the substrate. An isolation region (e.g., STI feature) may interpose the fins as discussed above with reference to the semiconductor device 100. Referring to the example of FIG. 10, a semiconductor device 1000 includes a substrate 102 having a fin 104. The semiconductor device 1000 may be substantially similar to the semiconductor device 100, described above with reference to FIGS. 1A and 1B.

A gate structure may be disposed on the substrate. In an embodiment, the gate structure is formed on and/or around a fin extending from the substrate. The gate structure may include a plurality of layers such as gate dielectric layers, gate electrode layers, capping layers, hard mask layers, and/or other suitable layers. In an embodiment, the gate structure is sacrificial such as provided in a replacement gate method of forming a metal gate structure. Referring to the example of FIG. 10, a gate structure 108 is disposed on the substrate 102. Specifically, gate structures 108 are disposed on the fin 104. Each gate structure 108 traverses the fin 104, separating a source region from a drain region and defining a channel region. In the semiconductor device 300, the fin 104 is illustrated as including a source/drain region 302 and a channel region 304. The gate structure 108 may be substantially similar to as discussed above with reference to the gate structure 108 of the semiconductor device 100 of FIGS. 1A and 1B.

The method 900 then proceeds to block 904 where one or more implantation processes are performed. The implantation process(es) may include a pre-amorphous implantation (PAI) and/or a junction forming implantation process (e.g., a source/drain implant.) A PAI process may implant a target region of the substrate, damaging the lattice structure of the target region and forming amorphized regions. The implantation process may include implanting species such as germanium (Ge), silicon (Si), carbon (C), xenon (Xe), and/or other suitable species. The PAI process may be performed at an energy of between approximately 0.5 keV and approximately 30 keV. In an embodiment, the PAI process is a substantially vertical implant (e.g., perpendicular to a top surface of the substrate.) In an embodiment, the PAI process is a tilt implant. The tilt angle may be between approximately 0 degrees and approximately 30 degrees. The junction implant may be performed separately or in-situ with a PAI process. The junction implant may provide suitable dopants (e.g., n-type, p-type) to form a doped region. The implantation may include introducing n-type or p-type dopants. Exemplary dopants include arsenic, phosphorous, antimony, boron, boron di-fluoride, and/or other possible impurities. In an embodiment, the junction implant of block 904 forms a source/drain extension region.

Figure 10:
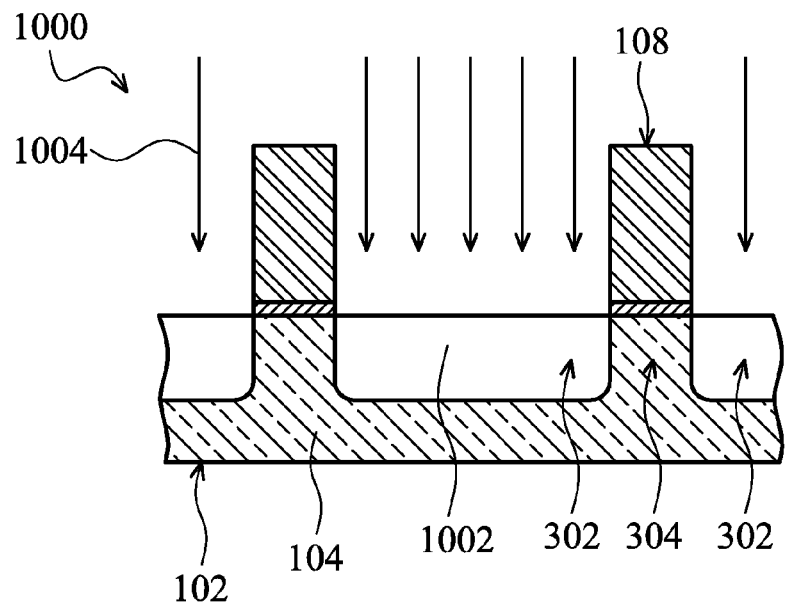
FIGS. 10, 11A, 11B, 12, 13, and 14 each illustrate cross-sectional views of one embodiment of a semiconductor device at various stages of fabrication according to the method of FIG. 9.

Referring to the example of FIG. 10, an implant 1004 is incident the substrate 102. The implant 1004 forms implanted regions 1002 of the fin 104. In an embodiment, the regions 1002 are amorphized. The implant 1004 may also or separately provide suitable dopants (e.g., n-type or p-type dopants) to provide a doped source/drain region 1002 of the device. The regions 1002 may include a source and drain extension region of semiconductor device 1000.

The depth of the implantation can be controlled by the implant energy, implant species, and/or implant dosage. The PAI process may implant the substrate with silicon (Si) or germanium (Ge). Alternatively, the PAI process could utilize other implant species, such as Ar, Xe, $BF_2$, As, In, other suitable implant species, or combinations thereof. The junction implant may include providing suitable n-type or p-type dopants.

The method 900 then proceeds to block 906 where a buffer layer is formed on the substrate. In an embodiment, the buffer layer is between approximately 20 Angstroms (A) and approximately 100 A in thickness. In an embodiment, the buffer layer may be between approximately 2 nm and approximately 5 nm in thickness. These thicknesses are by way of example and not intended to be limiting. In an embodiment, the buffer layer is an oxide such as silicon oxide. However, other compositions may be possible. Referring to the example of FIG. 11A, a buffer layer 402 is formed on the substrate 102.

Figure 11A:
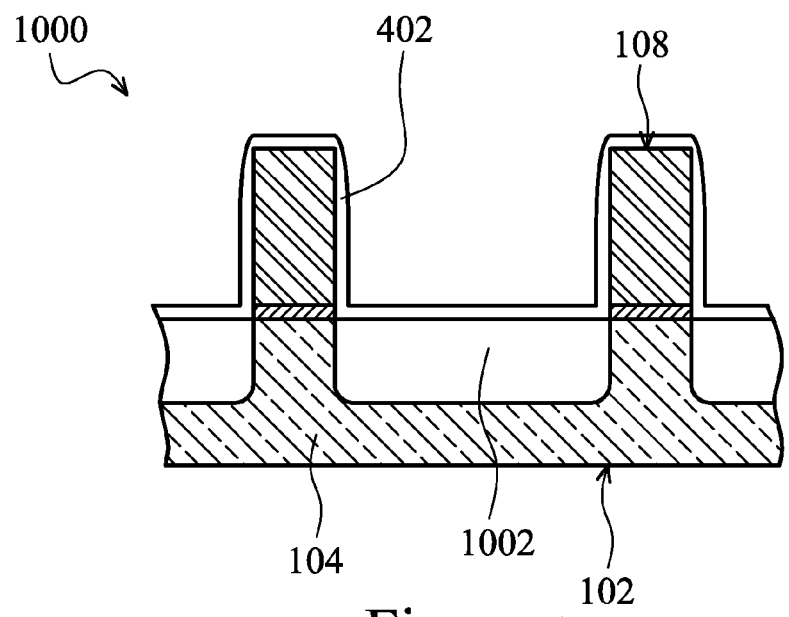
Figure 11B:
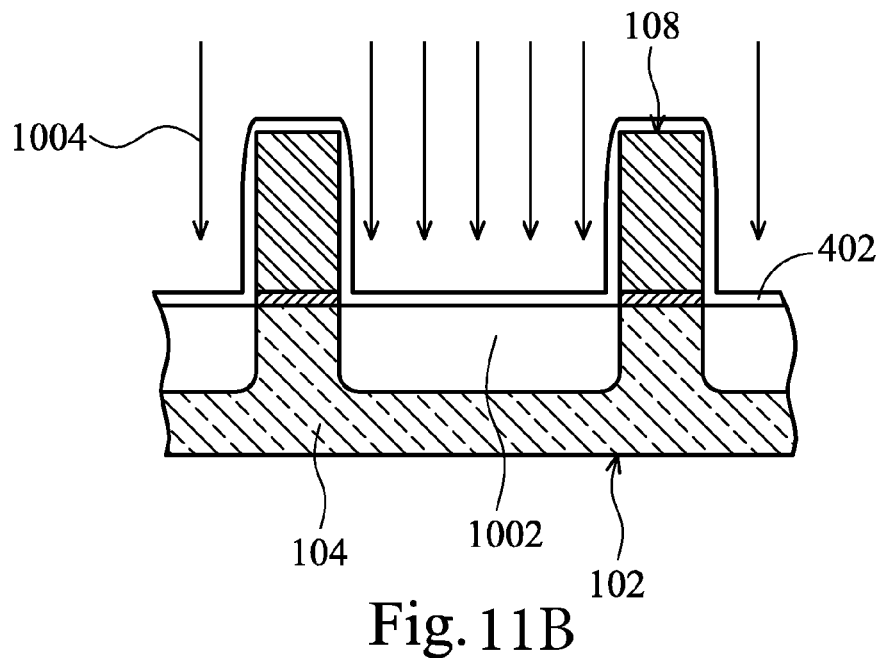
Figure 12:
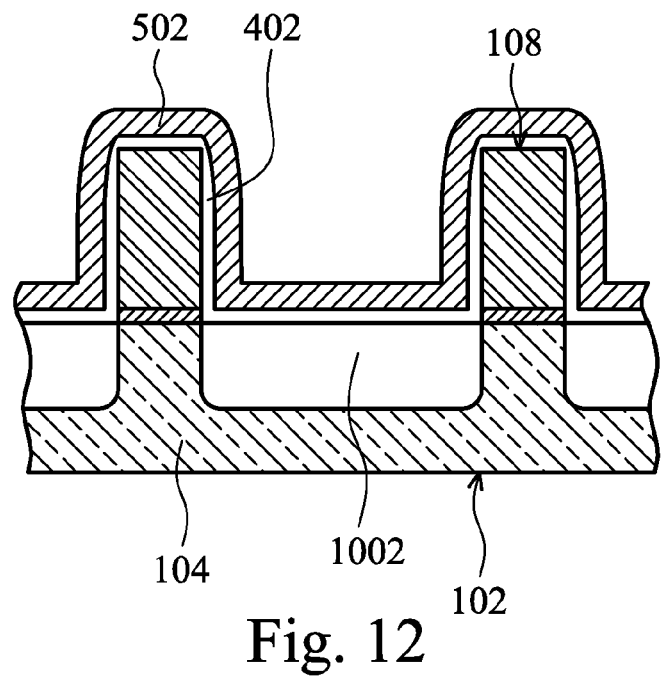
Figure 13:
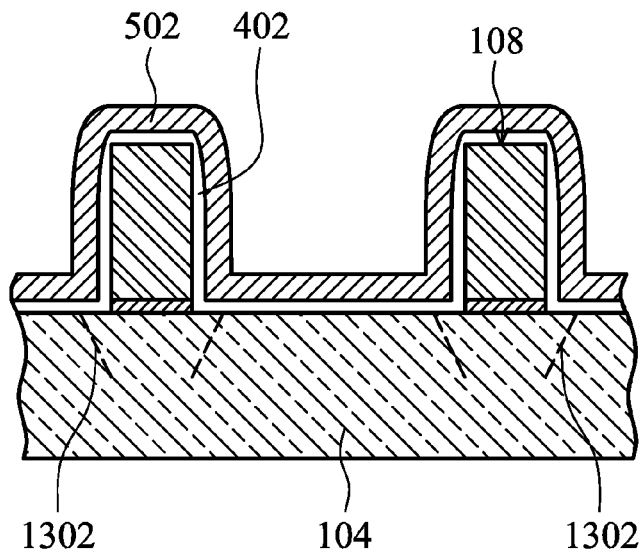
Figure 14:
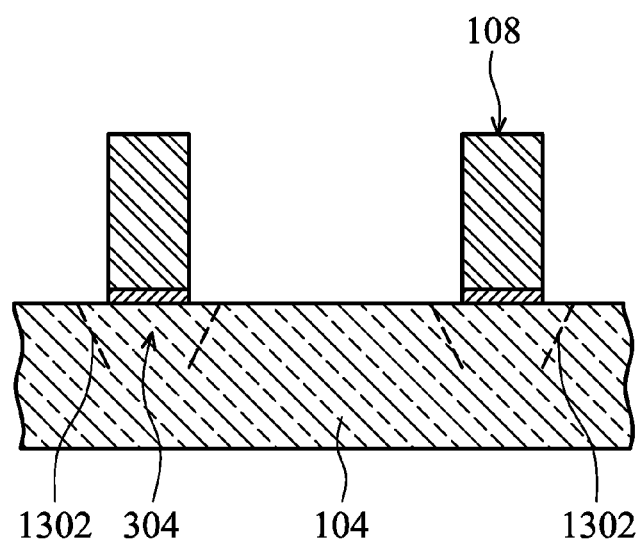

As described above, an implantation (e.g., PAI and/or junction implant) is performed prior to the formation of a buffer layer. However, in other embodiments, a buffer layer may be formed prior to the implant process(es) of block 904. In other words, block 906 may precede block 904. By way of example, FIG. 11B illustrates an implant 1004 (e.g., PAI, source/drain extension implant) while the buffer layer 402 is disposed on the substrate. The buffer layer 402 is formed prior to the implantation 1004.

The method 900 then proceeds to block 908 where a stress film is formed on the substrate. The stress film may also be referred to as a stress inducing film In an embodiment, the stress layer is a stress memorization technique (SMT) film. The stress layer may be provided over the device in which stress is desired and the stress of the stress film can be created and transferred to an underlying features/layers. In an embodiment, the stress film is silicon nitride (SiN). The stress film may have a thickness between approximately 200 A and approximately 400 A, by way of example. The stress film may have a compressive strain (i.e., be a compressive stress layer). (It is noted that the compressive strain of the stress layer may be converted to a tensile strain in a fin after block 910). In an embodiment, the stress film is between approximately 10 nm and approximately 40 nm in thickness. The stress film may be formed by plasma enhanced chemical vapor deposition (PECVD) and/or other suitable processes. Referring to the example of FIG. 12, a stress film 502 is disposed on the substrate 102. In an embodiment, the stress film 502 is a compressive stress film (e.g., having a compressive strain).

The method 900 then proceeds to block 910 where a stress inducing and/or junction forming process or treatment is performed. In an embodiment, the treatment includes an anneal process. The anneal may include a rapid thermal anneal (RTA), a single strand anneal (SSA), a laser anneal, a flash anneal, a furnace anneal and/or other suitable processes. In an embodiment, the treatment transfers a compressive strain of the stress film to provide a tensile stress to regions of the fin of the device. Referring to the example of FIG. 6, a strain (or stress) 1302 is provided in the fin 104. The strain/stress 1302 is generated by the stress film and/or stress inducing process. The process of block 910 may also serve to form the appropriate p-n junction depth for the semiconductor device 1000.

The method 900 then proceeds to block 912 where the stress film and/or buffer film is stripped from the substrate. The stress film and/or buffer film may be stripped using suitable etching techniques such as wet etch. The stress film and buffer film may be removed in a single process or a plurality of processes (e.g., distinct removal of each film). The strain in the fin induced by the stress film may remain after the stress layer is removed, for example, the strain having been transferred and "memorized" by the fin. Referring to the example of FIG. 14, the stress film 502 and the buffer layer 402 have been removed from the substrate. The strain 1302 remains in the fin 104. The strain 1302 may provide a symmetrical strain on the channel region 304 of the semiconductor device.

The method 900 may continue to include further CMOS or MOS technology processing to form various features known in the art. In an embodiment, spacer elements may be formed abutting sidewalls of a gate structure. The spacer elements may include silicon nitride, silicon oxide, silicon oxynitride, and/or other suitable dielectric materials. In embodiments, the sidewall spacers include a plurality of layers, for example, liner layers. A source/drain region may be further formed (e.g., in addition to an extension region formed as described above). The source/drain regions may be formed processes such as ion implantation, thermal diffusion, epitaxial growth, and/or other suitable processes. In an embodiment, a recess is etched in the fin at one or more of the source and/or drain regions. The recess may be etched using suitable etching technology such as dry etching, plasma etching, wet etching, and the like. In embodiments, the source/drain regions include epitaxial regions formed on and/or above the substrate. In a further embodiment, the epitaxial region may be formed in the etched recess of the fin. Care should be taken to preserve the strain provided by the method 900 in formation of the source/drain region.

Further exemplary processes that may be performed include the formation of contact features coupled to the gate structure and/or source/drain regions and a multi-layer interconnect (MLI) having via and interconnect lines that may interconnect one or more semiconductor devices formed on the substrate. In an embodiment, the gate structure described above is a sacrificial gate structure and a replacement gate is formed using a suitable replacement gate (e.g., gate last) methodology.

Figure 15:
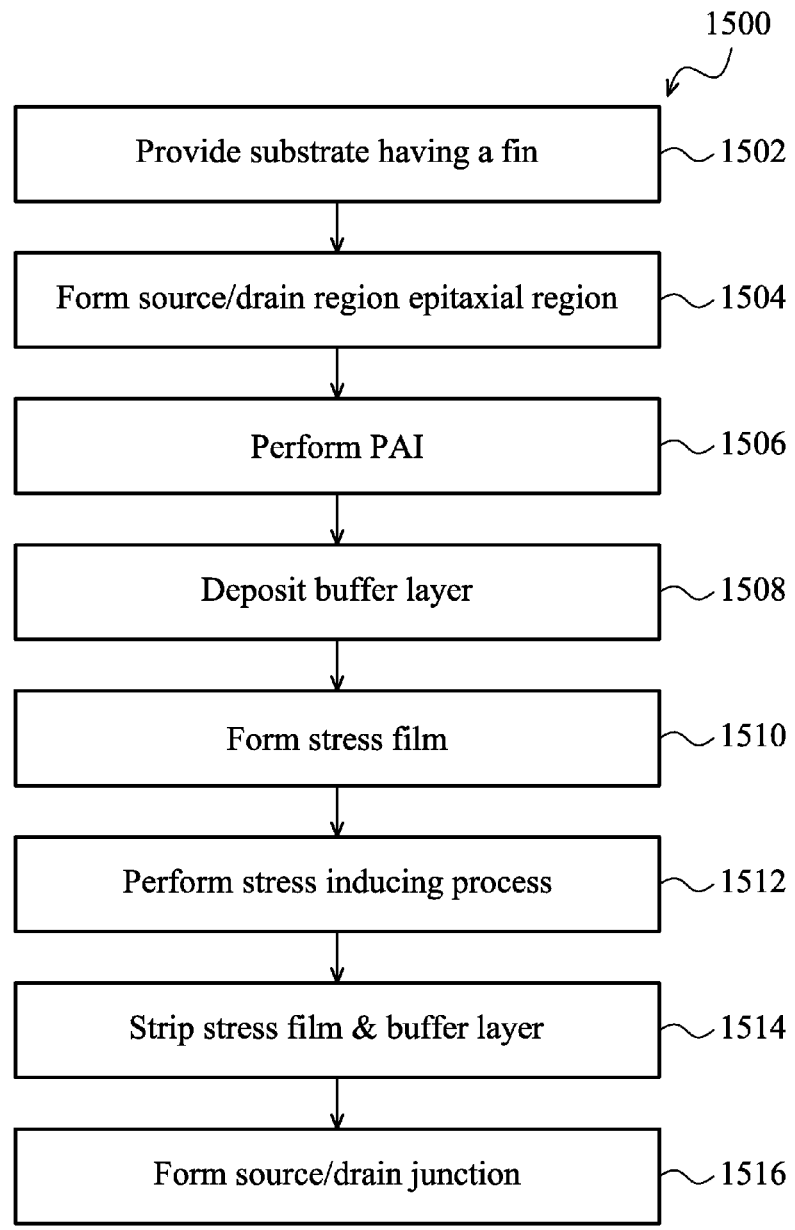
FIG. 15 is a flow chart illustrating another embodiment of a method of forming a semiconductor device according to various aspects of the present disclosure.

Referring now to FIG. 15, illustrated is flow chart of a method 1500 of semiconductor fabrication according to one or more aspects of the present disclosure. The method 1500 may be implemented to increase a stress or stain provided in one or more regions of a semiconductor device such as a fin-type field effect transistor (finFET). FIGS. 16A-24 are cross-sectional views of an embodiment of a semiconductor device 1600 fabricated according to steps the method 1500 of FIG. 15. FIGS. 16A-24B provide a device 1600 that may be substantially similar to the device 100, described above with reference to FIGS. 1A and 1B. Specifically, FIGS. 16A, 17A, 18A, 19A, 20A, 21A, 22A, 23A, and 24A provide views of a semiconductor device corresponding to the cut 116 illustrated above at FIGS. 1A and 1B. FIGS. 16B, 17B, 18B, 19B, 20B, 21B, 22B, 23B, and 24B provide views of the corresponding semiconductor device according to the cut 114 illustrated above at FIGS. 1A and 1B. It should be understood that FIGS. 16A-24B and the device 1600 are representative only and not intended to be limiting.

It should be further understood that the method 1500 includes steps having features of a complementary metal-oxide-semiconductor (CMOS) technology process flow and thus, are only described briefly herein. Additional steps may be performed before, after and/or during the method 1500. Similarly, one may recognize other portions of a device that may benefit from the methods described herein. It is also understood that parts of the semiconductor device 1600 may be fabricated by CMOS technology and thus, some processes are only described briefly herein. Further, the semiconductor device 1600 may include various other devices and features, such as additional transistors, bipolar junction transistors, resistors, capacitors, diodes, fuses, etc., but is simplified for a better understanding of the inventive concepts of the present disclosure. The semiconductor device 1600 may include a plurality of devices interconnected.

The method 1500 begins at block 1502 where a semiconductor substrate is provided. The semiconductor substrate may be substantially similar to as discussed above with reference to the semiconductor substrate 102 of the semiconductor device 100, described with reference to FIG. 1. In an embodiment, the semiconductor substrate includes a plurality of fins extending from the substrate. An isolation region (e.g., STI feature) may interpose the fins as discussed above with reference to the semiconductor device 100. Referring to the example of FIGS. 16A and 16B, a semiconductor device 1600 includes a substrate 102 having a plurality of fins 104. The semiconductor device 1600 may be substantially similar to the semiconductor device 100, described above with reference to FIGS. 1A and 1B.

A gate structure may be disposed on the substrate. In an embodiment, the gate structure is formed on and/or around a fin extending from the substrate. The gate structure may include a plurality of layers such as gate dielectric layers, gate electrode layers, capping layers, hard mask layers, and/or other suitable layers. In an embodiment, the gate structure is sacrificial such as provided in a replacement gate method of forming a metal gate structure. Referring to the example of FIGS. 16A and 16B, a gate structure 108 is disposed on the substrate 102. Specifically, gate structures 108 are disposed on the fin 104. Each gate structure 108 traverses the fin 104, separating a source region from a drain region and defining a channel region. The gate structure 108 may be substantially similar to as discussed above with reference to the gate structure 108 of the semiconductor device 100 of FIGS. 1A and 1B.

The method 1500 then proceeds to block 1504 where a source/drain epitaxial region is grown on the substrate. In an embodiment, a recess is etched in the fin at one or more of the source and/or drain regions. The recess may be etched using suitable etching technology such as dry etching, plasma etching, wet etching, and the like. In an embodiment, one or more photolithography processes are used to form masking elements such that the remaining regions of the substrate are protected from the etching process. In an embodiment, the epitaxial region is grown in the recessed region of the fin.

The epitaxial region is grown in/on the fin(s). The epitaxial region may be grown by solid-phase epitaxy (SPE). The SPE process may convert an amorphous region of semiconductor material to crystalline structure to form the epitaxial region. In other embodiments, other epitaxial growth processes may be used such as vapor-phase epitaxy. The epitaxial region may include silicon, silicon phosphorus, (SiP), or silicon phosphorus carbide (SiPC). Other exemplary epitaxial compositions include germanium, gallium arsenide, gallium nitride, aluminum gallium indium phosphide, silicon germanium, silicon carbide, and/or other possible compositions. In an embodiment, impurities are added to the epitaxial layer during the growth (e.g., in-situ doping). Exemplary dopants include arsenic, phosphorous, antimony, boron, boron di-fluoride, and/or other possible impurities.

Figure 16A:
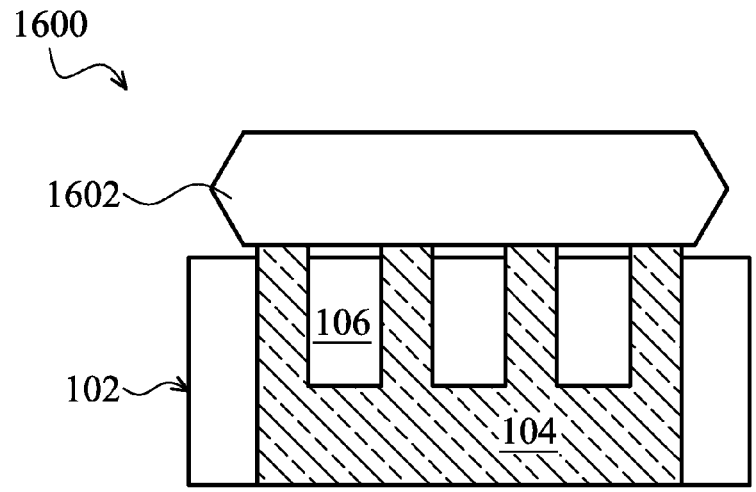
FIGS. 16A, 16B, 17A, 17B, 18A, 18B, 19A, 19B, 20A, 20B, 21A, 21B, 22A, and 22B each illustrate cross-sectional views of one embodiment of a semiconductor device at various stages of fabrication according to the method of FIG. 15.
Figure 16B:
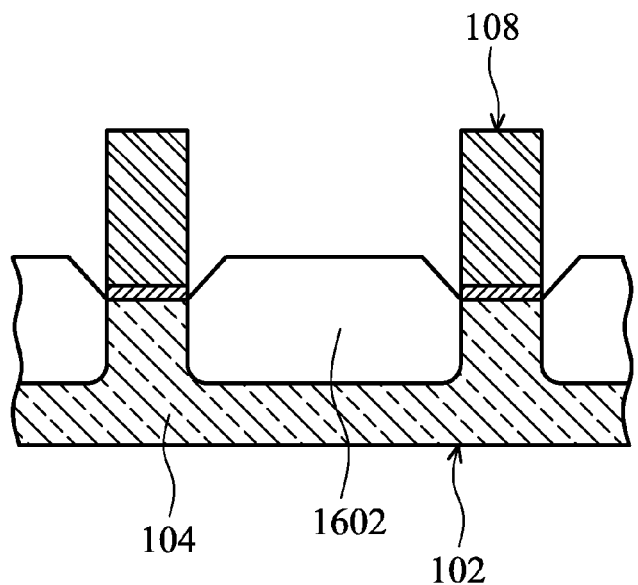
Figure 17A:
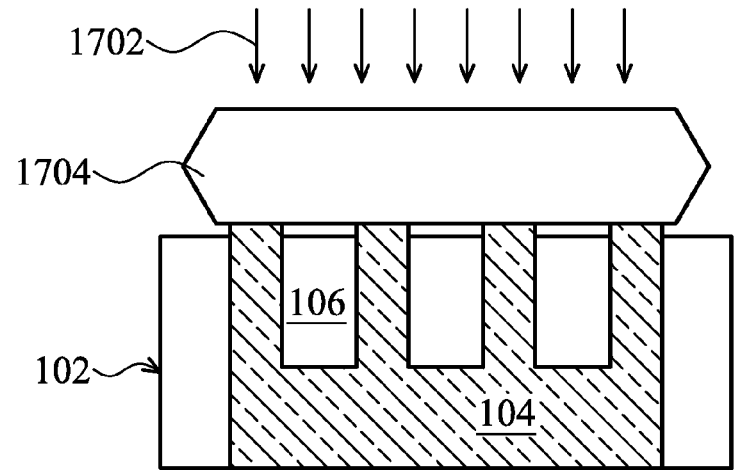
Figure 17B:
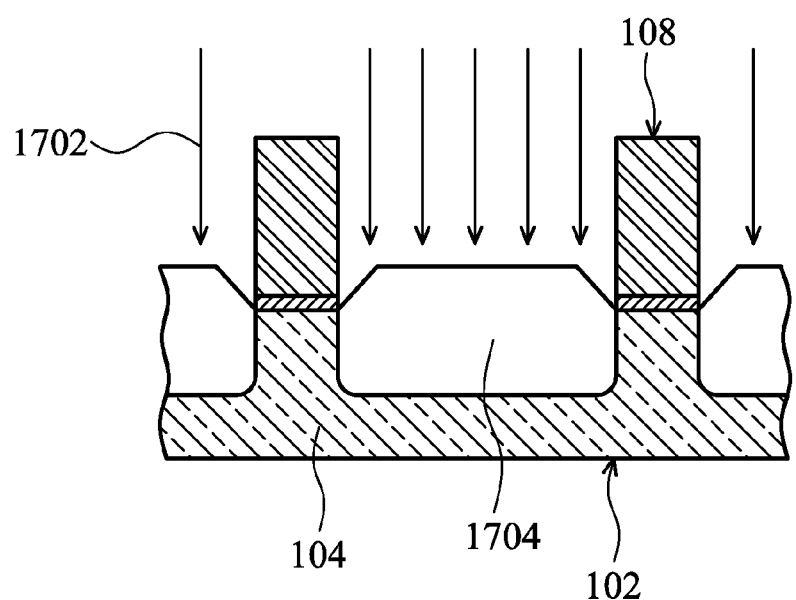
Figure 18A:
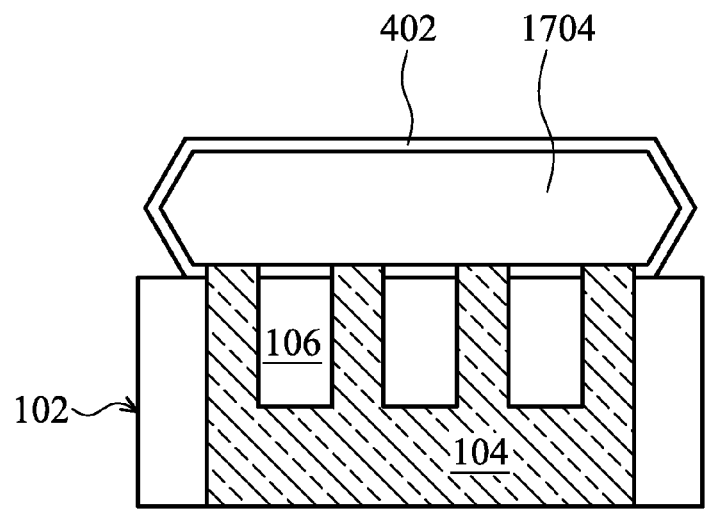
Figure 18B:
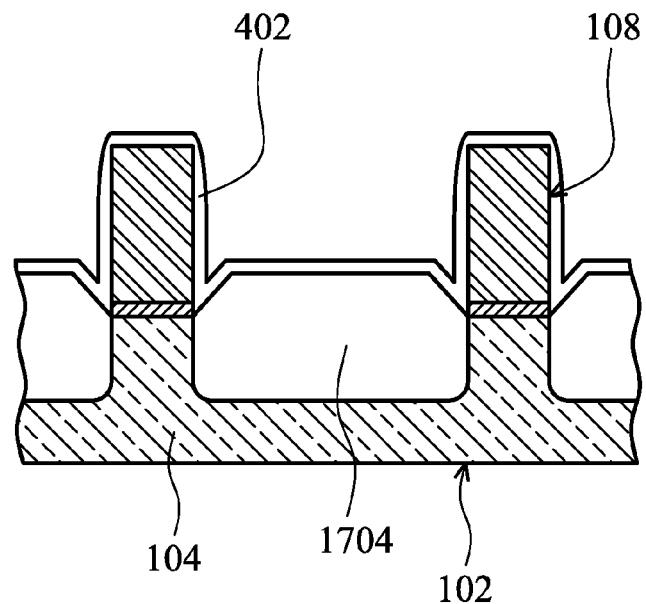
Figure 19A:
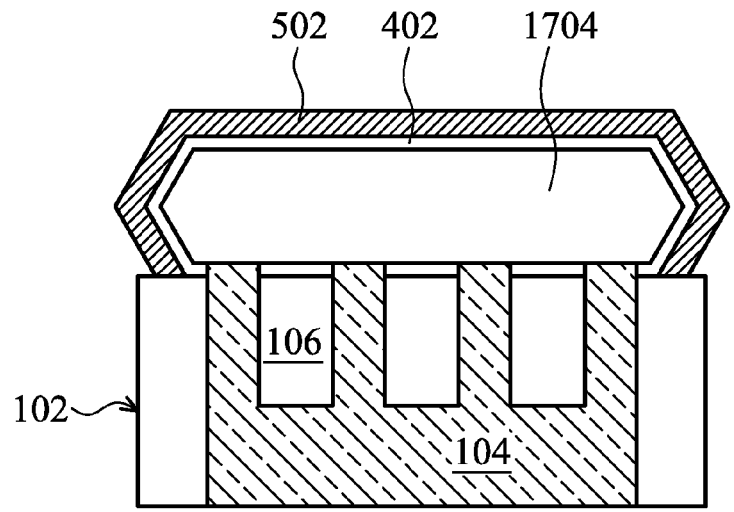
Figure 19B:
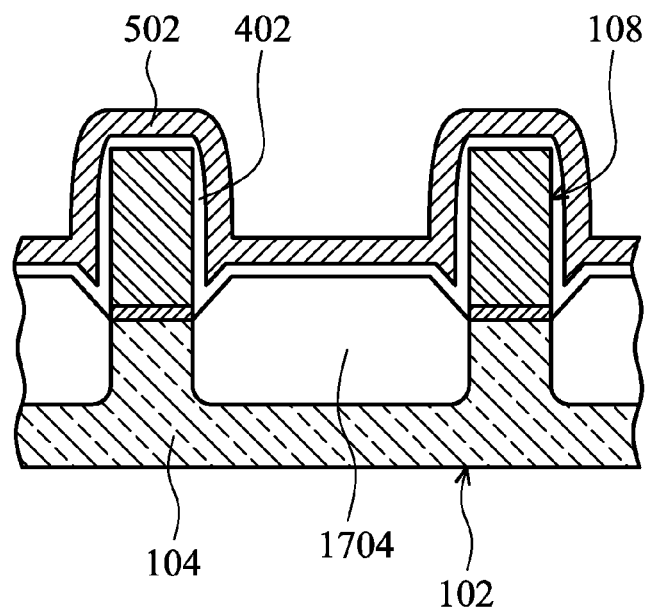
Figure 20A:
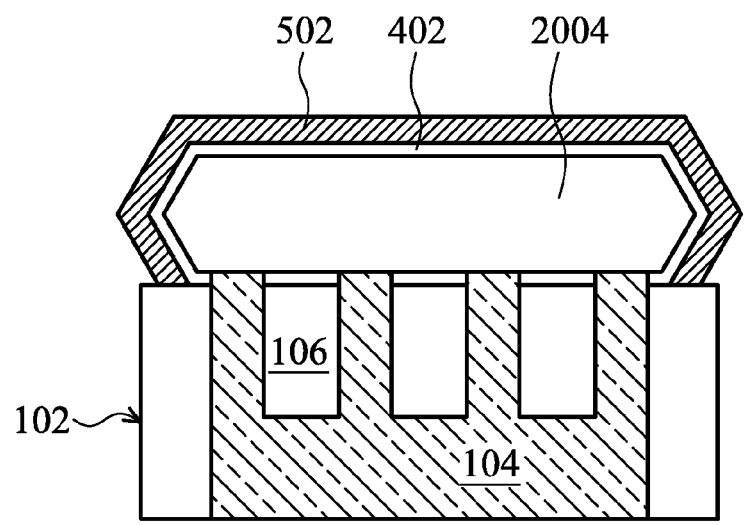
Figure 20B:
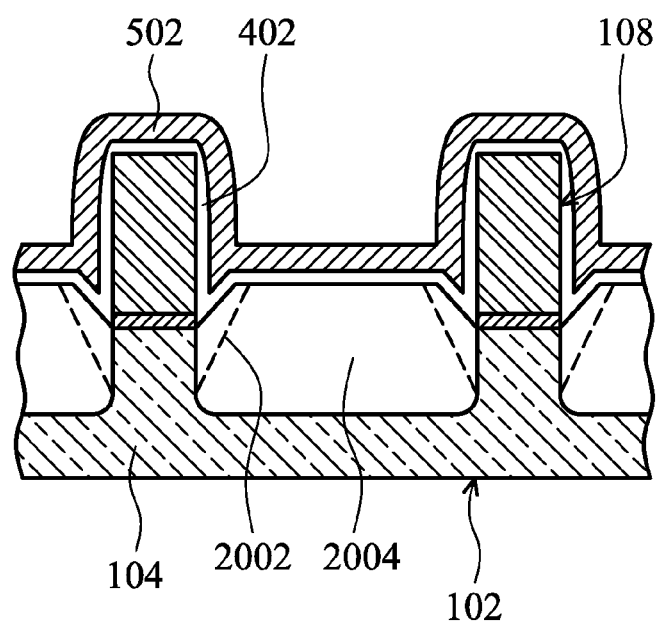
Figure 21A:
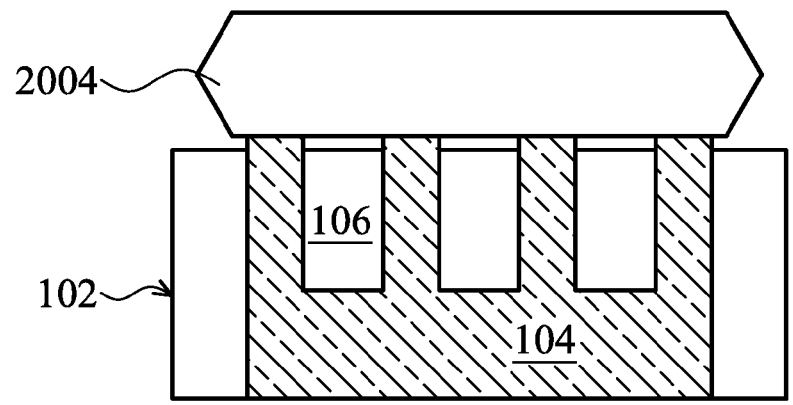
Figure 21B:
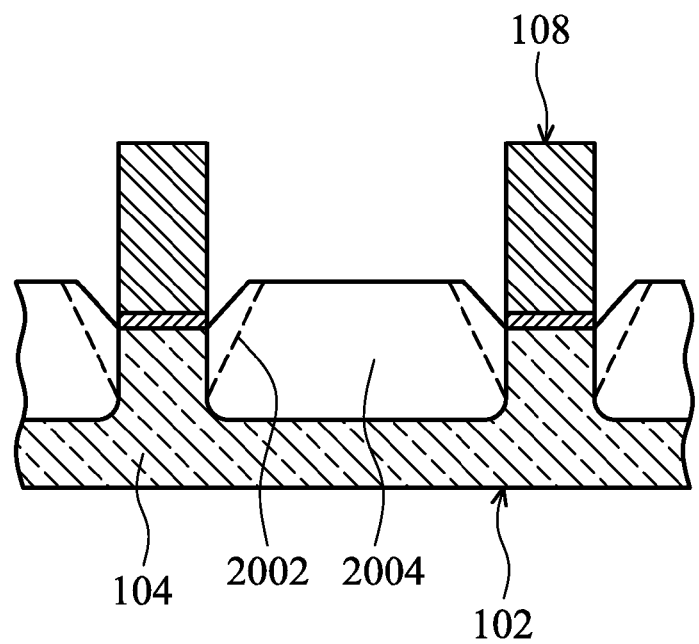
Figure 22A:
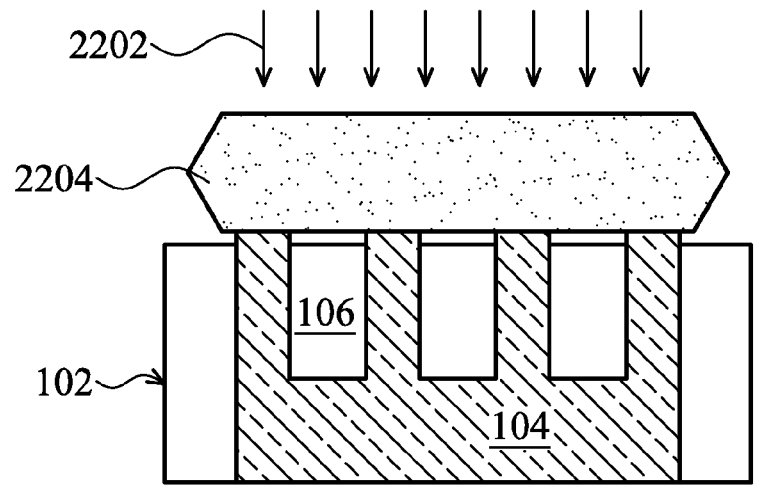
Figure 22B:
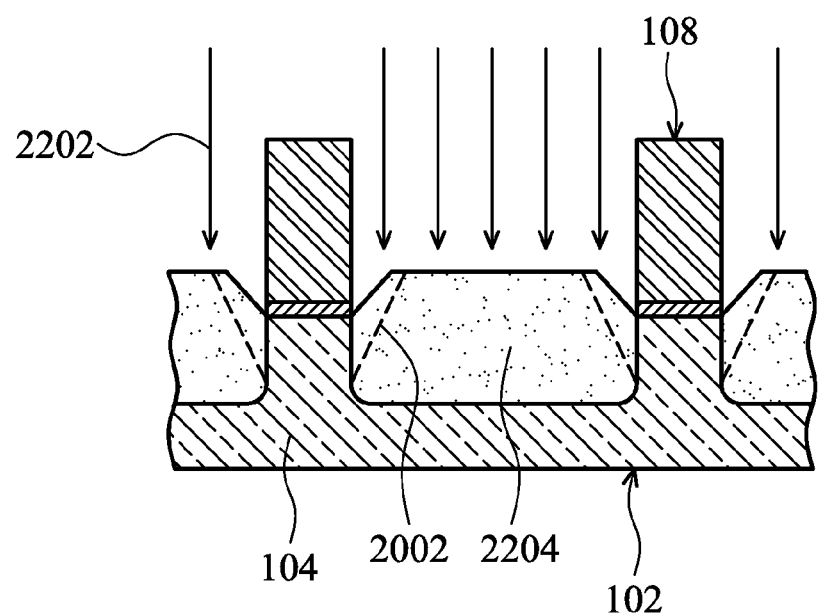

Referring to the example of FIGS. 16A and 16B, a source/drain region 1602 is provided on the substrate 102. The source/drain region 1602 includes an epitaxially-grown region.

The method 1500 then proceeds to block 1504 where a pre-amorphous implantation (PAI) process is performed. The implantation process may include implanting species such as germanium (Ge), silicon (Si), carbon (C), xenon (Xe), and/or other suitable species. The implantation process may be performed at an energy of between approximately 0.5 keV and approximately 30 keV. In an embodiment, the implantation process is a substantially vertical implant (e.g., perpendicular to a top surface of the substrate.) In an embodiment, the implantation process is a tilt implant. The tilt angle may be between approximately 0 degrees and approximately 30 degrees. Referring to the example of FIGS. 17A and 17B, a PAI 1702 is incident the substrate 102 forming implanted (amorphous) regions 1704.

The method 1500 then proceeds to block 1508 where a buffer layer is formed on the substrate. In an embodiment, the buffer layer is between approximately 20 Angstroms (A) and approximately 100 A in thickness. In an embodiment, the buffer layer may be between approximately 2 nm and approximately 5 nm in thickness. These thicknesses are by way of example and not intended to be limiting. In an embodiment, the buffer layer is an oxide such as silicon oxide. However, other compositions may be possible. Referring to the example of FIGS. 18A and 18B, a buffer layer 402 is formed on the substrate 102.

As described above, an implantation (e.g., PAI) is performed prior to the formation of a buffer layer. However, in other embodiments, a buffer layer may be formed prior to the implantation process of block 1506. In other words, block 1508 may precede block 1506.

The method 1500 then proceeds to block 1510 where a stress film is formed on the substrate. The stress film may also be referred to as a stress inducing film In an embodiment, the stress layer is a stress memorization technique (SMT) film. The stress layer may be provided over the device in which stress is desired. The stress of the stress film can be created and transferred to an underlying features/layers. In an embodiment, the stress film is silicon nitride (SiN). The stress film may have a thickness between approximately 200 A and approximately 400 A, by way of example. The stress film may have a compressive strain (e.g., is a compressive stress layer). (It is noted that the compressive strain of the stress layer may be converted to a tensile strain in a fin region after block 1512). In an embodiment, the stress film is between approximately 10 nm and approximately 40 nm in thickness. The stress film may be formed by plasma enhanced chemical vapor deposition (PECVD) and/or other suitable processes. Referring to the example of FIGS. 17A and 17B, a stress film 502 is disposed on the substrate 102. The stress film 502 may be a compressive stress film.

The method 1500 then proceeds to block 1512 where a stress inducing and/or transferring process or treatment is performed. In an embodiment, the treatment includes an anneal process. The anneal may include a rapid thermal anneal (RTA), a single strand anneal (SSA), a laser anneal, a flash anneal, a furnace anneal and/or other suitable processes. In an embodiment, the treatment transfers a compressive strain of the stress film to a fin region to provide a tensile stress in a channel region of the fin. Referring to the example of FIGS. 20A and 20B, a strain (or stress) 2002 is provided creating stressed region 2004 from region 1704. The strain/stress 2002 is generated by the stress film and/or stress inducing process. The strain/stress 2002 may provide a symmetrical stress onto a channel region of the fin 104.

The method 1500 then proceeds to block 1514 where the stress film and/or buffer film is stripped from the substrate. The stress film and/or buffer film may be stripped using suitable etching techniques such as wet etch. The stress film and buffer film may be removed in a single process or a plurality of processes (e.g., distinct removal of each film). The strain induced by the stress film may remain after the stress layer is removed, for example, as it is has been transferred and "memorized" by the fin region. Referring to the example of FIGS. 21A and 21B, the stress film 502 and the buffer layer 402 have been removed from the substrate. The strain 2002 remains in the region 2004 of the fin 104.

The method 1500 then proceeds to block 1516 where a junction region is formed. The junction region may be formed using an ion implantation process to provide a doped region. The formation of the junction may include suitably doping a source/drain region of the semiconductor device (e.g., n-type or p-type dopants). The implantation may include introducing n-type or p-type dopants. Exemplary dopants include arsenic, phosphorous, antimony, boron, boron di-fluoride, and/or other possible impurities. In an embodiment, spacer elements may be formed abutting sidewalls of a gate structure prior to one or more junction implantation processes. The spacer elements may include silicon nitride, silicon oxide, silicon oxynitride, and/or other suitable dielectric materials. In embodiments, the sidewall spacers include a plurality of layers, for example, liner layers. In other embodiments, the implantation process may be performed prior to the formation of any spacer elements and/or the spacer elements omitted. Referring to the example of FIGS. 22A and 22B, an implantation process 2202 is illustrated. The implantation 2202 may provide a suitably doped region 2204 (n-type or p-type dopants) in which to form a source/drain region associated with the corresponding gate structure 108. The source/drain region may include a source/drain extension region.

The method 1500 may continue to include further CMOS or MOS technology processing to form various features known in the art. Exemplary processes that may be performed include the formation of contact features coupled to the gate structure and/or source/drain regions and a multi-layer interconnect (MLI) having via and interconnect lines that may interconnect one or more semiconductor devices formed on the substrate. In an embodiment, the gate structure described above is a sacrificial gate structure and a replacement gate is formed using a suitable replacement gate (e.g., gate last) methodology.

Figure 23:
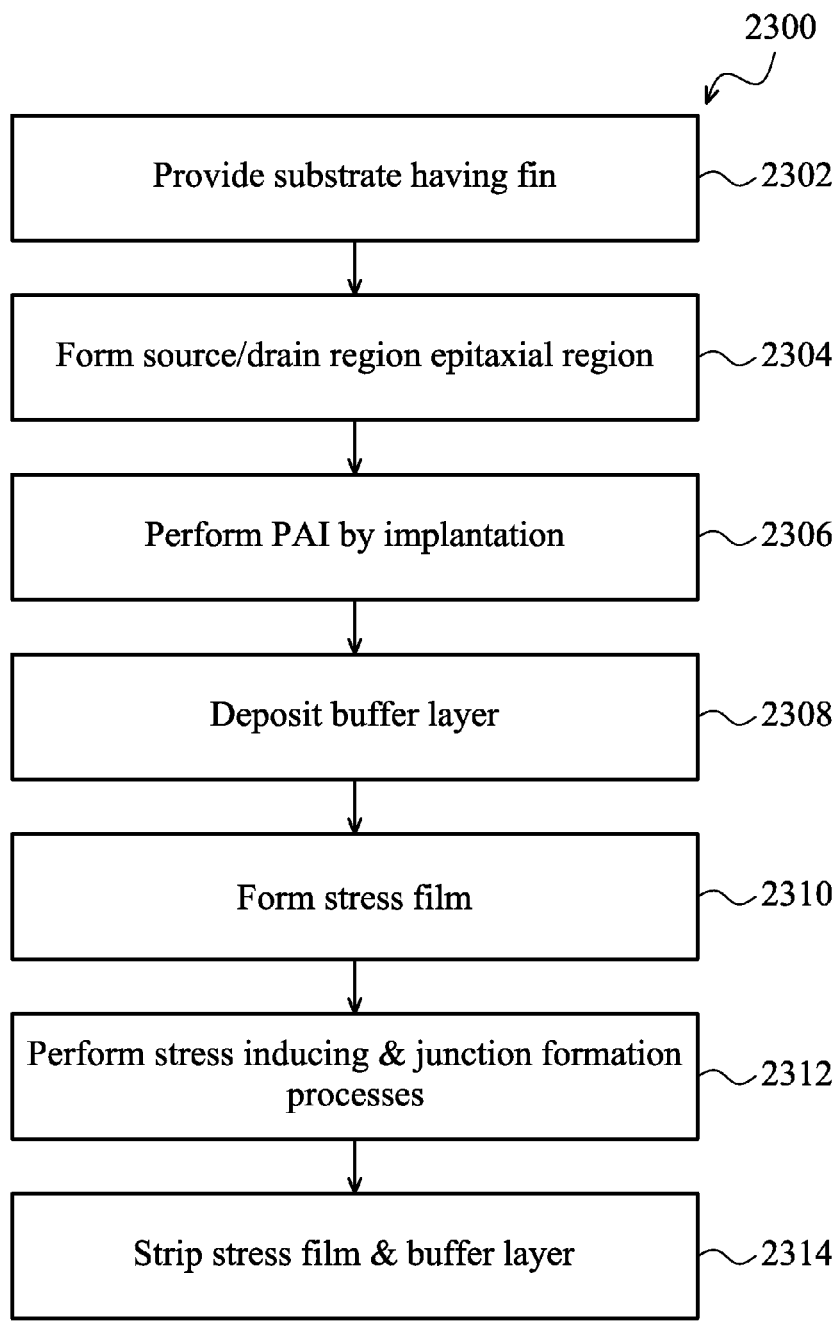
FIG. 23 is a flow chart illustrating another embodiment of a method of forming a semiconductor device according to various aspects of the present disclosure.

Referring now to FIG. 23, illustrated is flow chart of a method 2300 of semiconductor fabrication according to one or more aspects of the present disclosure. The method 2300 may be implemented to increase a stress or stain provided in one or more regions of a semiconductor device such as a fin-type field effect transistor (finFET). FIGS. 24A-29B are cross-sectional views of an embodiment of a semiconductor device 2400 fabricated according to steps the method 2300 of FIG. 23. The semiconductor device 2400 may be substantially similar to the device 100, described above with reference to FIGS. 1A and 1B. For example, FIGS. 24A, 25A, 26A, 27A, 28A, and 29A provide views of a semiconductor device corresponding to the cut 116 illustrated above at FIGS. 1A and 1B. FIGS. 24B, 25B, 26B, 27B, 28B, and 29B provide views of the corresponding semiconductor device according to the cut 114 illustrated above at FIGS. 1A and 1B. It should be understood that FIGS. 24A-29B and the device 2400 are representative only and not intended to be limiting.

It should be further understood that the method 2300 includes steps having features of a complementary metal-oxide-semiconductor (CMOS) technology process flow and thus, are only described briefly herein. Additional steps may be performed before, after and/or during the method 2300. Similarly, one may recognize other portions of a device that may benefit from the methods described herein. It is also understood that parts of the semiconductor device 2400 may be fabricated by CMOS technology and thus, some processes are only described briefly herein. Further, the semiconductor device 2400 may include various other devices and features, such as additional transistors, bipolar junction transistors, resistors, capacitors, diodes, fuses, etc., but is simplified for a better understanding of the inventive concepts of the present disclosure. The semiconductor device 2400 may include a plurality of devices interconnected.

The method 2300 begins at block 2302 where a semiconductor substrate is provided. The semiconductor substrate may be substantially similar to as discussed above with reference to the semiconductor substrate 102 of the semiconductor device 100, described with reference to FIGS. 1A and 1B. In an embodiment, the semiconductor substrate includes a plurality of fins extending from the substrate. An isolation region (e.g., STI feature) may interpose the fins as discussed above with reference to the semiconductor device 100. Referring to the example of FIGS. 24A and 24B, a semiconductor device 2400 includes a substrate 102 having a plurality of fins 104. The semiconductor device 2400 may be substantially similar to the semiconductor device 100, described above with reference to FIGS. 1A and 1B.

A gate structure may be disposed on the substrate. In an embodiment, the gate structure is formed on and/or around a fin extending from the substrate. The gate structure may include a plurality of layers such as gate dielectric layers, gate electrode layers, capping layers, hard mask layers, and/or other suitable layers. In an embodiment, the gate structure is sacrificial such as provided in a replacement gate method of forming a metal gate structure. Referring to the example of FIGS. 26A and 26B, a gate structure 108 is disposed on the substrate 102. Specifically, gate structures 108 are disposed on the fin 104. Each gate structure 108 traverses the fin 104, separating a source region from a drain region and defining a channel region. The gate structure 108 may be substantially similar to as discussed above with reference to the gate structure 108 of the semiconductor device 100 of FIGS. 1A and 1B.

The method 2300 then proceeds to block 2304 where a source/drain epitaxial region is grown on the substrate. In an embodiment, a recess is etched in the fin at one or more of the source and/or drain regions. The recess may be etched using suitable etching technology such as dry etching, plasma etching, wet etching, and the like. In an embodiment, one or more photolithography processes are used to form masking elements such that the remaining regions of the substrate are protected from the etching process. In an embodiment, the epitaxial region is grown in the recessed region of the fin.

The epitaxial region is grown in/on/surrounding the fin(s). The epitaxial region may be grown by solid-phase epitaxy (SPE). The SPE process may convert an amorphous region of semiconductor material to crystalline structure to form the epitaxial region. In other embodiments, other epitaxial growth processes may be used such as vapor-phase epitaxy. The epitaxial region may include silicon, silicon phosphorus, (SiP), or silicon phosphorus carbide (SiPC). Other exemplary epitaxial compositions include germanium, gallium arsenide, gallium nitride, aluminum gallium indium phosphide, silicon germanium, silicon carbide, and/or other possible compositions. In an embodiment, impurities are added to the epitaxial layer during the growth (e.g., in-situ doping). Exemplary dopants include arsenic, phosphorous, antimony, boron, boron di-fluoride, and/or other possible impurities.

Figure 24A:
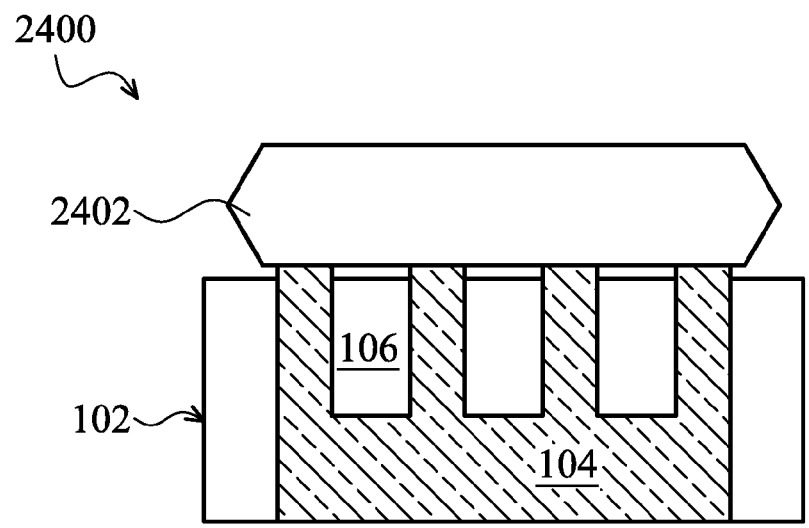
FIGS. 24A, 24B, 25A, 25B, 26A, 26B, 27A, 27B, 28A, 28B, 29A, and 29B each illustrate cross-sectional views of one embodiment of a semiconductor device at various stages of fabrication according to the method of FIG. 23.
Figure 24B:
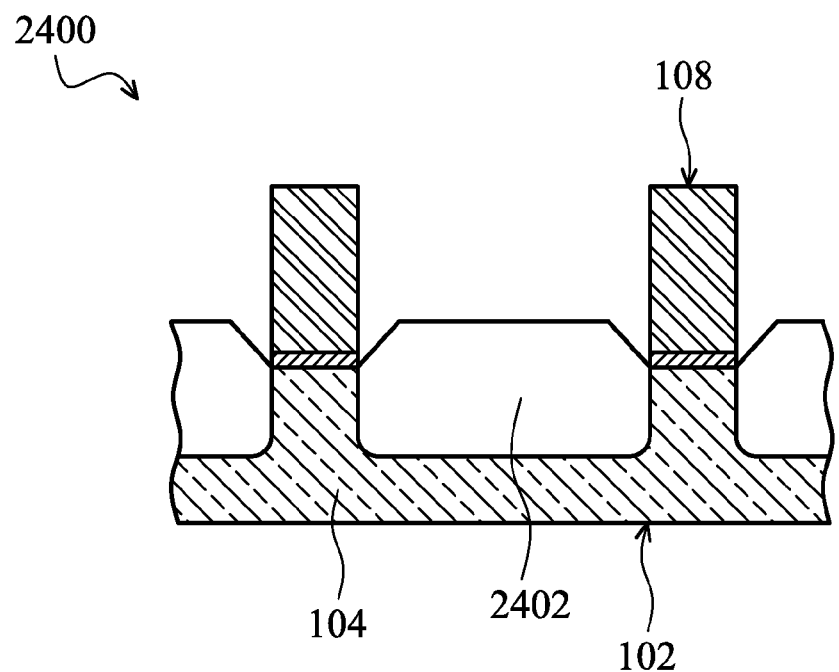

Referring to the example of FIGS. 24A and 24B, a source/drain region 2402 is provided on the substrate 102. The source/drain region 2402 includes an epitaxially-grown region.

The method 2300 then proceeds to block 2306 where one or more implantation processes are performed. The implantation process(es) may include a pre-amorphous implantation (PAI) and/or a junction forming implantation process (e.g., a source/drain extension forming implant.) A PAI process may implant a target region of the substrate, damaging the lattice structure of the target region and forming amorphized regions. The implantation process may include implanting species such as germanium (Ge), silicon (Si), carbon (C), xenon (Xe), and/or other suitable species. The PAI process may be performed at an energy of between approximately 0.5 keV and approximately 30 keV. In an embodiment, the PAI process is a substantially vertical implant (e.g., perpendicular to a top surface of the substrate.) In an embodiment, the PAI process is a tilt implant. The tilt angle may be between approximately 0 degrees and approximately 30 degrees. The junction implantation may be performed separately or in-situ with a PAI process. The junction implantation may provide suitable dopants (e.g., n-type, p-type) to form a doped region to provide a suitable p-n junction for the semiconductor device. The implantation to form the junction may include introducing n-type or p-type dopants. Exemplary dopants include arsenic, phosphorous, antimony, boron, boron difluoride, and/or other possible impurities.

Figure 25A:
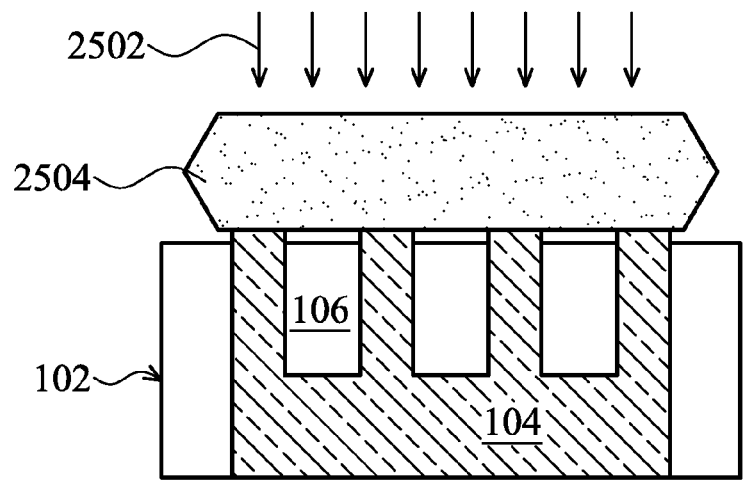
Figure 25B:
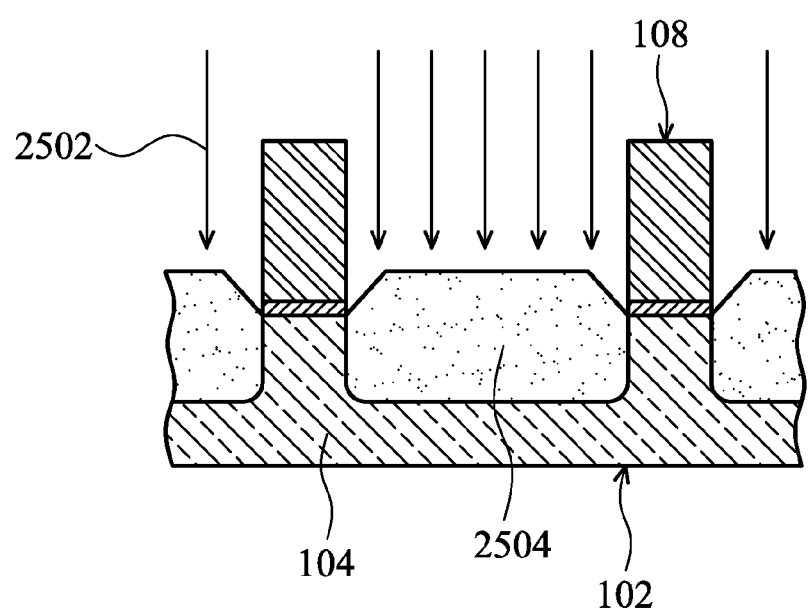
Figure 26A:
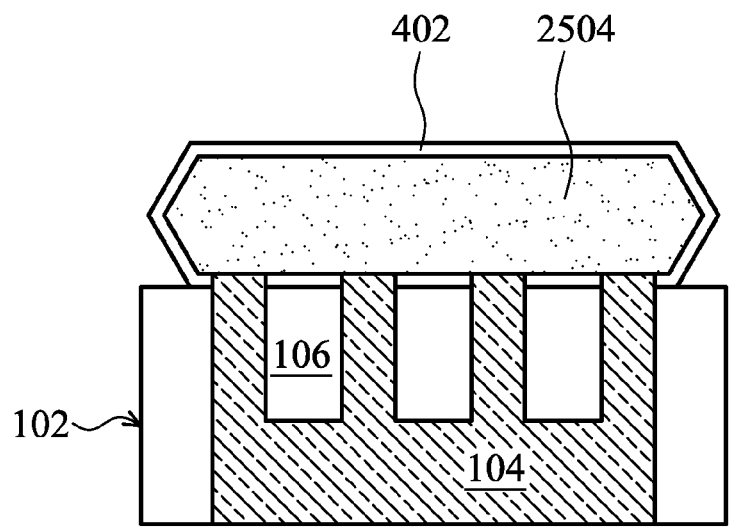
Figure 26B:
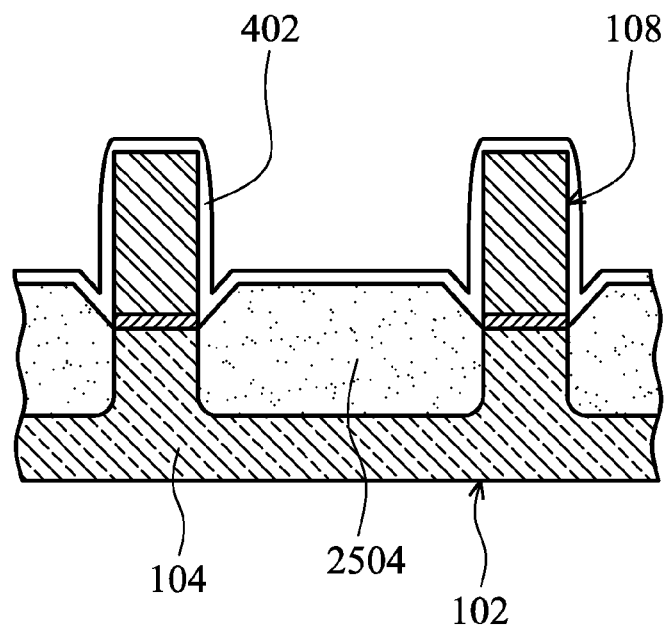
Figure 27A:
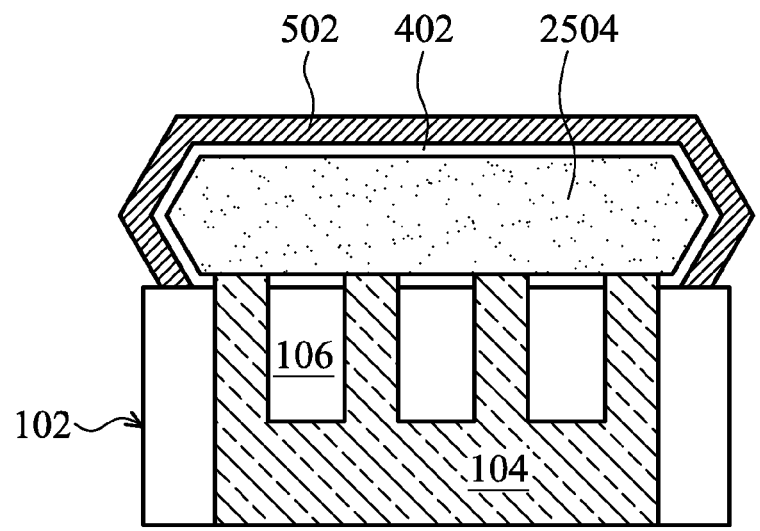
Figure 27B:
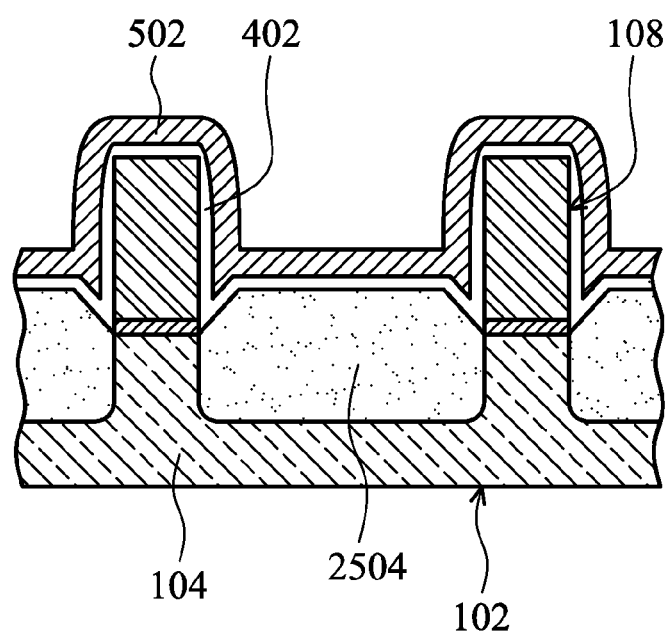
Figure 28A:
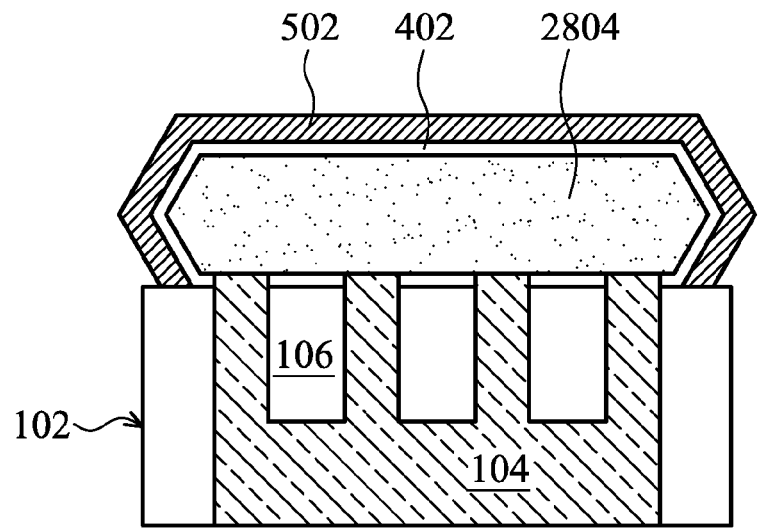
Figure 28B:
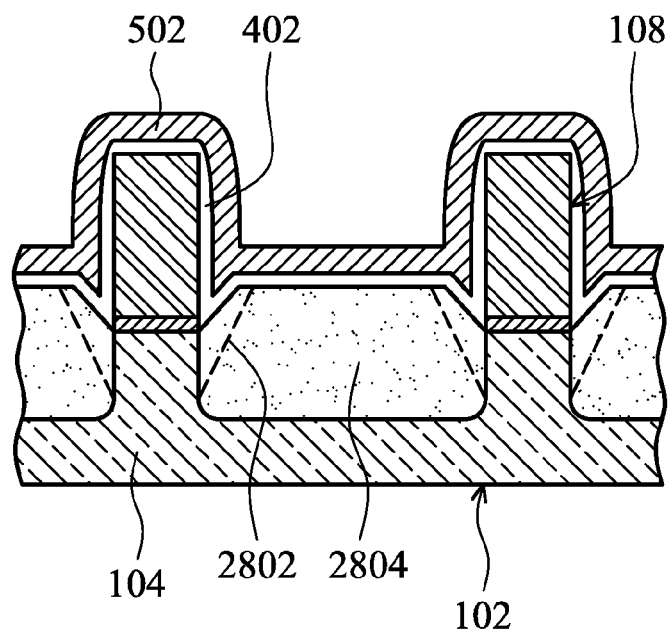
Figure 29A:
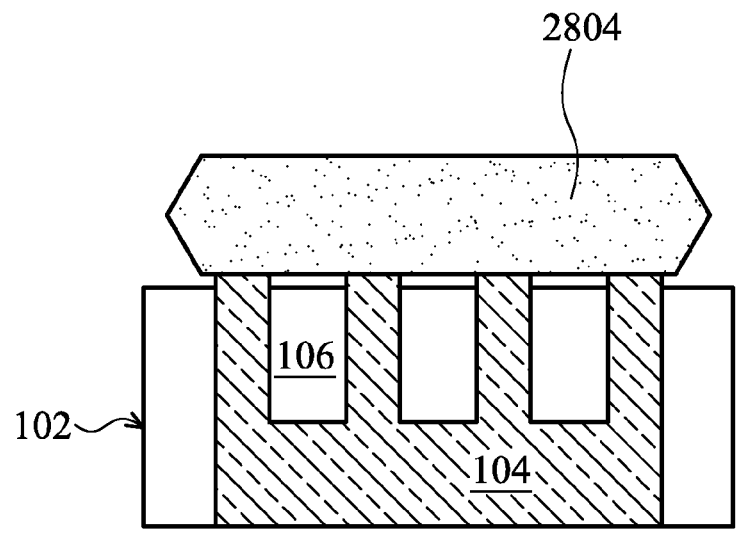
Figure 29B:
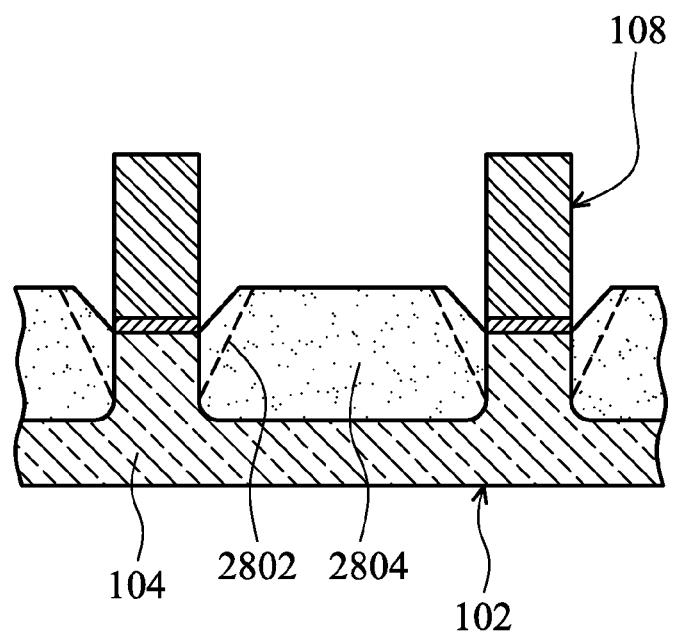

Referring to the example of FIGS. 25A and 25B, an implantation 2502 is incident the substrate 102. The implantation 2502 forms implanted regions 2504 of the region 2402, described above with reference to FIGS. 24A and 24B. In an embodiment, the regions 2504 are amorphized. The implantation 2502 may provide suitable dopants (e.g., n-type or p-type dopants) to provide a suitably doped source/drain region 2504 of the device. In the present embodiment, the regions 2504 provide a source and drain region of semiconductor device 2400.

The method 2300 then proceeds to block 2308 where a buffer layer is formed on the substrate. In an embodiment, the buffer layer is between approximately 20 Angstroms (A) and approximately 100 A in thickness. In an embodiment, the buffer layer may be between approximately 2 nm and approximately 5 nm in thickness. These thicknesses are by way of example and not intended to be limiting. In an embodiment, the buffer layer is an oxide such as silicon oxide. However, other compositions may be possible. Referring to the example of FIGS. 26A and 26B, a buffer layer 402 is formed on the substrate 102.

As described above, an implantation (e.g., PAI and/or junction implant) is performed prior to the formation of a buffer layer. However, in other embodiments, a buffer layer may be formed prior to the implantation process of block 2306. In other words, block 2308 may precede block 2306.

The method 2300 then proceeds to block 2310 where a stress film is formed on the substrate. The stress film may also be referred to as a stress inducing film In an embodiment, the stress layer is a stress memorization technique (SMT) film. The stress layer may be provided over the device in which stress is desired and the stress of the stress film can be created and transferred to an underlying features/layers. In an embodiment, the stress film is silicon nitride (SiN). The stress film may have a thickness between approximately 200 A and approximately 400 A, by way of example. The stress film may have a compressive strain—e.g., be a compressive stress film. (It is noted that the compressive strain of the stress film may be converted to a tensile strain in a fin after block 1512). In an embodiment, the stress film is between approximately 10 nm and approximately 40 nm in thickness. The stress film may be formed by plasma enhanced chemical vapor deposition (PECVD) and/or other suitable processes. Referring to the example of FIGS. 27A and 27B, a stress film 502 is disposed on the substrate 102. The stress film 502 may be a compressive stress film.

The method 2300 then proceeds to block 2312 where a stress inducing and/or junction forming process or treatment is performed. In an embodiment, the treatment includes an anneal process. The anneal may include a rapid thermal anneal (RTA), a single strand anneal (SSA), a laser anneal, a flash anneal, a furnace anneal and/or other suitable processes. In an embodiment, the treatment transfers a compressive strain of the stress film to provide a tensile stress to underlying regions of the device, such as the fin and/or a channel region of the fin. Referring to the example of FIGS. 28A and 28B, a strain (or stress) 2802 is provided in region 2804. The strain/stress 2802 is generated by the stress film and/or treatment processes. The process of block 2312 may also serve to form the appropriate p-n junction depth for the semiconductor device 2400.

The method 2300 then proceeds to block 2314 where the stress film and/or buffer film is stripped from the substrate. The stress film and/or buffer film may be stripped using suitable etching techniques such as wet etch. The stress film and buffer film may be removed in a single process or a plurality of processes (e.g., distinct removal of each film). The strain induced by the stress film may remain after the stress layer is removed, for example, as the stress has been transferred and "memorized" by the fin region. Referring to the example of FIGS. 29A and 29B, the stress film 502 and the buffer layer 402 have been removed from the substrate. The strain 2802 remains in the fin 104. The strain 2802 may provide a symmetrical strain on the channel region of the semiconductor device 2400.

The method 2300 may continue to include further CMOS or MOS technology processing to form various features known in the art. Further exemplary processes that may be performed include the formation of contact features coupled to the gate structure and/or source/drain regions and a multi-layer interconnect (MLI) having via and interconnect lines that may interconnect one or more semiconductor devices formed on the substrate. In an embodiment, the gate structure described above is a sacrificial gate structure and a replacement gate is formed using a suitable replacement gate (e.g., gate last) methodology.

Thus, it will be appreciated that provided are methods and devices that provide for a stressed/strain region in one or more regions of a finFET device. The strained region is provided by transferring stress from an overlying (sacrificial) stressing layer. The strained region may provide a stress onto the channel region of the finFET device (e.g., underlying the gate structure). In an embodiment, a tensile strain is provided in the channel region. The present disclosure provides advantages as proper channel stress can enhance transistor performance including carrier mobility.

It is understood that different embodiments disclosed herein offer different disclosure, and that they may make various changes, substitutions and alterations herein without departing from the spirit and scope of the present disclosure. For example, the embodiments disclosed herein describe formation of a tensile stress in a fin region. However, other embodiments may include forming a compressive stress in fin region by providing the relevant stress layer (e.g., stress-transferring layer) overlying the fin region. Examples of compressive stress generating films may include metal nitride compositions.

What is claimed is:

1. A method of fabricating a fin-type field effect transistor, comprising:
   providing a substrate having a plurality of fins;
   forming a gate structure on the fin, wherein the gate structure interfaces at least two sides of one or more of the plurality of fins;
   growing an epitaxial region on the substrate, wherein the epitaxial region interfaces with each of the plurality of fins;
   performing a pre-amorphous implantation (PAI) process on the epitaxial region;
   forming a stress layer on the epitaxial region after the PAI process; and
   treating the substrate and the stress layer, wherein the treating transfers a stress from the stress layer to the epitaxial region.

2. The method of claim 1, wherein the transferred stress provides a tensile strain in a channel region of each of the plurality of fins.

3. The method of claim 1, wherein the treating includes an anneal selected from the group consisting of a rapid thermal anneal (RTA), a laser anneal, a flash anneal, and a furnace anneal.

4. The method of claim 1, further comprising:
stripping the stress layer after the treating the substrate.

5. The method of claim 1, further comprising:
implanting the epitaxial region to form one of an n-type and a p-type region.

6. The method of claim 1, further comprising:
forming a buffer layer on the epitaxial region prior to performing the PAI process.

7. The method of claim 1, further comprising:
forming a buffer layer on the epitaxial region and underlying the stress layer, wherein the forming the buffer layer is performed after performing the PAI process.

8. The method of claim 1, further comprising:
performing a junction implant process on the epitaxial region prior to forming the stress layer.

9. The method of claim 1, wherein the growing the epitaxial region includes providing a contiguous epitaxial region that interfaces with each of the plurality of fins.

10. The method of claim 9, wherein the plurality of fins includes at least four fins.

11. A method of fabricating a fin-type field effect transistor, comprising:
providing a substrate having a first and a second fins;
growing an contiguous epitaxial region on the first and second fins, wherein the contiguous epitaxial region merges the first and second fins;
performing a pre-amorphous implantation (PAI) process on the contiguous epitaxial region;
forming a stress layer on the contiguous epitaxial region after the PAI process; and
annealing the substrate including the stress layer.

12. The method of claim 11, further comprising:
forming a gate structure on a plurality of surfaces of each of the first and second fins.

13. The method of claim 11, wherein the forming the stress layer forms the stress layer such that it does not interpose the first and second fin.

14. The method of claim 11, further comprising:
etching a recess in each of the first and the second fins; and
wherein the growing the contiguous epitaxial region includes growing epitaxial material in the recesses.

15. The method of claim 11, wherein the growing the contiguous epitaxial region includes performing a solid-phase epitaxy process.

16. The method of claim 11, wherein the growing the contiguous epitaxial region includes doping epitaxial material with an impurity.

17. A method of fabricating a transistor, comprising:
growing an epitaxial region on a plurality of fins of a semiconductor substrate, wherein the epitaxial region interfaces with each of the plurality of fins;
performing a pre-amorphous implantation (PAI) process on the epitaxial region to form an amorphized epitaxial region;
forming a compressive layer on the amorphized epitaxial region after the PAI process;
treating the substrate and the compressive layer, wherein the treating transfers a stress from the compressive layer to the amorphized epitaxial region.

18. The method of claim 17, wherein the transferred stress provides a tensile strain in a channel region of each of the plurality of fins.

19. The method of claim 17, further comprising:
performing a junction implant process on the epitaxial region prior to forming the compressive layer.

20. The method of claim 19, further comprising:
forming a buffer layer on the epitaxial region and underlying the compressive layer, wherein the forming the buffer layer is performed after performing the PAI process.

* * * * *